(12) United States Patent
Asatsuma et al.

(10) Patent No.: US 7,532,654 B2
(45) Date of Patent: May 12, 2009

(54) LASER DIODE

(75) Inventors: Tsunenori Asatsuma, Kanagawa (JP);
Yoshiro Takiguchi, Kanagawa (JP);
Shoji Hirata, Kanagawa (JP)

(73) Assignee: Sony Corporation (JP)

( * ) Notice: Subject to any disclaimer, the term of this patent is extended or adjusted under 35 U.S.C. 154(b) by 196 days.

(21) Appl. No.: 11/123,168

(22) Filed: May 6, 2005

(65) Prior Publication Data

US 2005/0254538 A1    Nov. 17, 2005

(30) Foreign Application Priority Data

May 12, 2004    (JP) .............................. 2004-142187

(51) Int. Cl.
*H01S 3/04*    (2006.01)

(52) U.S. Cl. .............. 372/43.01; 372/44.01; 372/46.01; 372/46.015; 372/49.01; 372/50.1

(58) Field of Classification Search .............. 372/43.01, 372/44.01, 49.01, 46.01, 46.015, 50.1, 29.01
See application file for complete search history.

(56) References Cited

U.S. PATENT DOCUMENTS

| | | | |
|---|---|---|---|
| 4,998,258 A * | 3/1991 | Ikeda et al. ............... | 372/49.01 |
| 5,173,914 A * | 12/1992 | Kokubo .................... | 372/49.01 |
| 5,247,536 A * | 9/1993 | Kinoshita .................... | 372/96 |
| 5,481,120 A * | 1/1996 | Mochizuki et al. ............ | 257/49 |
| 5,657,338 A * | 8/1997 | Kitamura ................... | 372/50.1 |
| 6,590,918 B1 * | 7/2003 | Mannou et al. .......... | 372/45.01 |
| 6,608,850 B1 * | 8/2003 | Inaba ....................... | 372/45.01 |
| 6,680,958 B1 * | 1/2004 | Nemoto ................... | 372/43.01 |
| 6,744,797 B2 * | 6/2004 | Kuniyasu et al. ....... | 372/45.011 |
| 2002/0064196 A1 * | 5/2002 | Shiozawa et al. ............ | 372/45 |

FOREIGN PATENT DOCUMENTS

| | | | |
|---|---|---|---|
| JP | 63-208293 | | 8/1988 |
| JP | 02-100391 | | 4/1990 |
| JP | 03-076189 | | 4/1991 |
| JP | 06-204609 | | 7/1994 |
| JP | 07-106703 | | 4/1995 |
| JP | 11-054834 | | 2/1999 |
| JP | 2000-174385 | | 6/2000 |
| JP | 2000-252583 | * | 9/2000 |
| JP | 2003-060286 | | 2/2003 |
| JP | 2004-128297 | | 4/2004 |

OTHER PUBLICATIONS

Japanese Office Action dated Jun. 20, 2008 for corresponding Japanese Application No. 2004-142187.
Japanese Office Action dated Mar. 7, 2008 for corresponding Japanese Application No. 2004-142187.

* cited by examiner

*Primary Examiner*—Sue Purvis
*Assistant Examiner*—Fei Fei Yeung Lopez
(74) *Attorney, Agent, or Firm*—Rader Fishman & Grauer PLLC; Ronald P. Kananen

(57) ABSTRACT

A laser diode capable of effectively inhibiting effects of return light is provided. A laser diode includes a substrate, and a laminated structure including a first conductive semiconductor layer, an active layer having a light emitting region, and a second conductive semiconductor layer having a projecting part on the surface thereof, on the substrate, wherein a return light inhibition part is provided on a main-emitting-side end face, and effects of return light in the vicinity of lateral boundaries of the light emitting region are inhibited by the return light inhibition part.

14 Claims, 14 Drawing Sheets

LASER DIODE

BACKGROUND OF THE INVENTION

1. Field of the Invention

The present invention relates to a laser diode such as a broad area type laser diode.

2. Description of the Related Art

An LD (laser diode) is not only used as a light source in an optical disk device such as a CD (Compact Disk) and a DVD (Digital Versatile Disk), but also applied to various fields such as a display, a printing product, fabricating materials, and medical care. In these application fields, high output is often desirable, and therefore, a high power laser diode is increasingly aspired.

As one method to improve output, in the case of a laser diode having a stripe-shape light emitting region, it is effective to widen a width of the light emitting region, that is, a stripe width. For example, in a laser diode for an optical disk, a typical value of the stripe width is about 2 µm to 3 µm. Meanwhile, of the laser diodes developed for high output use, a laser diode whose stripe width is widened to 50 µm to 100 µm has been introduced. The laser diode whose stripe width is widened as above is referred to as a broad area type laser diode. A specific numerical value of the stripe width, being a standard for the "broad area type" laser diode herein described has not been determined. However, in this specification, for example, the stripe width thereof shall be about 10 µm or more.

SUMMARY OF THE INVENTION

In general, a laser diode is susceptible to light returned to the laser itself reflected by an optical system or an illumination target after emission, that is, return light. When being affected by the return light, laser oscillation becomes unstable, which is undesirable in practice. In addition, in some cases, the laser may become deteriorated or get out of order.

Such effects of the return light have similarly become disadvantages in the case of the foregoing broad area type laser diode. Since the broad area type laser diode further includes characteristics of high power, it is difficult to inhibit effects of return light by utilizing an external device such as an isolator and a wavelength plate, and therefore, such disadvantages are more serious in the broad area type laser diode.

For example, Japanese Unexamined Patent Application Publication No. 2000-252583, as a laser diode used as a harmonic light source and the like, a laser diode, in which effects of return light from an exterior resonator are eliminated by narrowing a stripe width on the opposite side of a laser beam emitting side in the shape of a taper has been suggested.

In view of the foregoing, it is desirable to provide a laser diode capable of effectively inhibiting effects of return light.

According to an embodiment of the invention, there is provided a laser diode including a substrate and a laminated structure including a first conductive semiconductor layer, an active layer having a light emitting region, and a second conductive semiconductor layer having a projecting part on the surface thereof on the substrate, wherein a return light inhibition part is provided on a main-emitting-side end face, and effects of return light in the vicinity of lateral boundaries of the light emitting region are inhibited by the return light inhibition part. Here, "lateral boundary of the light emitting region" means a boundary between the light emitting region and a non light emitting region other than the light emitting region in the active layer. The laser diode is applicable to the following embodiments in particular.

As a first embodiment, a notch part can be provided at least in one corner of a projecting part in a main-emitting-side end face as the return light inhibition part.

As a second embodiment, a reflector film is included in a main-emitting-side end face as the return light inhibition part, and in the reflector film, laser light reflectance to the vicinity of a lateral center of a light emitting region is higher than laser light reflectance to the vicinity of lateral boundaries of the light emitting region.

As a third embodiment, two groove-like concave parts extending in the same direction are provided on the surface of a second conductive semiconductor layer as the return light inhibition part, and a width of the two groove-like concave parts in the vicinity of a main-emitting-side end face is larger than a width thereof in the vicinity of the center between the main-emitting-side end face and an opposite-side end face.

As a fourth embodiment, in a main-emitting-side end face, a normal end face, which includes vicinity of a lateral center of a light emitting region and is parallel to an opposite-side end face, and an inclined plane, which includes vicinity of a lateral boundary of the light emitting region and is inclined to the normal end face are provided as the return light inhibition part.

As a fifth embodiment, an impurity-doped region is provided at least in one corner of a main-emitting-side end face as the return light inhibition part, and the impurity-doped region includes a corner of a projecting part in the main-emitting-side end face.

In this specification, "lateral" means the direction perpendicular to both the extension direction (resonator direction) of the projecting part and the direction, in which the semiconductor layers including the active layer are laminated on the substrate (lamination direction). "Width" means a dimension in the lateral direction. "Length" means a dimension in the resonator direction. "Thickness" or "depth" means a dimension in the lamination direction. The lamination direction and the resonator direction are perpendicular to each other.

According to an embodiment of the invention, the return light inhibition part is provided in the main-emitting-side end face, and effects of return light in the vicinity of the lateral boundaries of the light emitting region are inhibited by the return light inhibition part. Therefore, even if the return light approaches or enters in the vicinity of the lateral boundaries of the light emitting region, the effects thereof can be inhibited. Consequently, the effects of return light can be effectively inhibited, and reliability can be improved.

In the first embodiment, the notch part is provided in the main-emitting-side end face as the return light inhibition part. Therefore, light emitting is not generated in the vicinity of the lateral boundary of the light emitting region. Consequently, even if return light approaches or enters, the effects thereof can be inhibited.

In the second embodiment, the reflector film is provided in the main-emitting-side end face as the return light inhibition part, and in the reflector film, the laser light reflectance to the vicinity of the lateral center of the light emitting region is set higher than the laser light reflectance to the vicinity of the lateral boundaries. Therefore, a light intensity distribution in the light emitting region is not uniform over the whole lateral region, but can be larger in the vicinity of the center and smaller in the vicinity of the boundaries. Consequently, even if return light approaches or enters in the vicinity of the lateral boundaries of the light emitting region, an optical absolute amount coupling (interacting) with the return light becomes small, and effects of the return light can be effectively inhibited.

In the third embodiment, as the return light inhibition part, the width of the two groove-like concave parts in the vicinity of the main-emitting-side end face is larger than the width thereof in the vicinity of the center between the main-emitting-side end face and the opposite-side end face. Therefore, even if the width of a structural light emitting region defined by the two groove-like concave parts is uniform, the width of an effective light emitting region in the vicinity of the main-emitting-side end face can be narrowed. Consequently, even if return light approaches in the vicinity of the lateral boundaries of the structural light emitting region, the return light is hard to enter in the effective light emitting region, and the effects of return light can be effectively inhibited.

In the fourth embodiment, the inclined plane is provided in the main-emitting-side end face as the return light inhibition part. Therefore, even if return light approaches in the vicinity of the lateral boundaries of the light emitting region, the return light is diagonally reflected by the inclined plane and is hard to enter, and effects of the return light can be effectively inhibited.

In the fifth embodiment, the impurity-doped region is provided in the main-emitting-side end face as the return light inhibition part, and the impurity-doped region includes the corner of the projecting part in the main-emitting-side end face. Therefore, in the impurity-doped region, optical loss can be intentionally generated. Consequently, even if return light approaches or enters in the vicinity of the lateral boundaries of the light emitting region, the effects thereof can be inhibited.

Other and further objects, features and advantages of the invention will appear more fully from the following description.

DETAILED DESCRIPTION OF THE PREFERRED EMBODIMENTS

Embodiments of the invention will be hereinafter described in detail with reference to the drawings.

Though the following respective embodiments differ from each other in the embodied aspects of each return light inhibition part, these embodiments have in common the fact that effects of return light approaching or entering particularly in the vicinity of lateral boundaries of a light emitting region is focused attention on and is to be inhibited. Therefore, before descriptions of individual specific embodiments, descriptions will be given of differences of effects depending on entering positions of return light as a common assumption forming a basis of the invention based on experimental results.

(Experiment)

Figure 1:
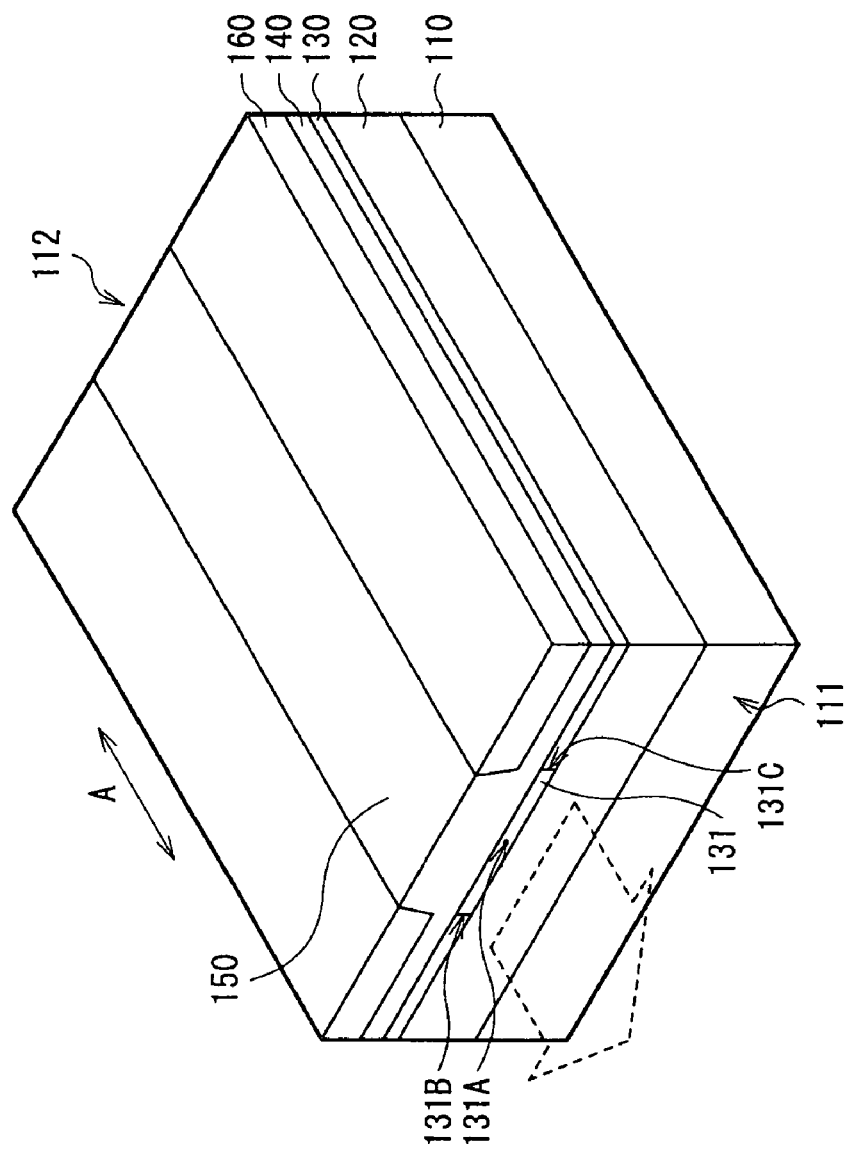
FIG. 1 is a perspective view showing a construction of a laser diode used in an experiment for examining effects of return light on the laser diode.
Figure 2:
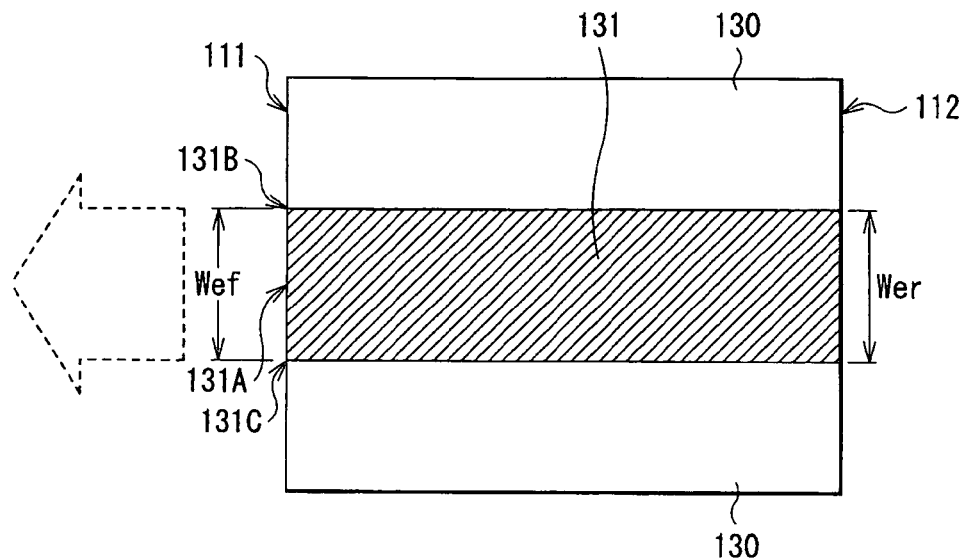
FIG. 2 is a plan view showing a pattern diagram of a shape of a light emitting region of the laser diode shown in FIG. 1.
Figure 3:
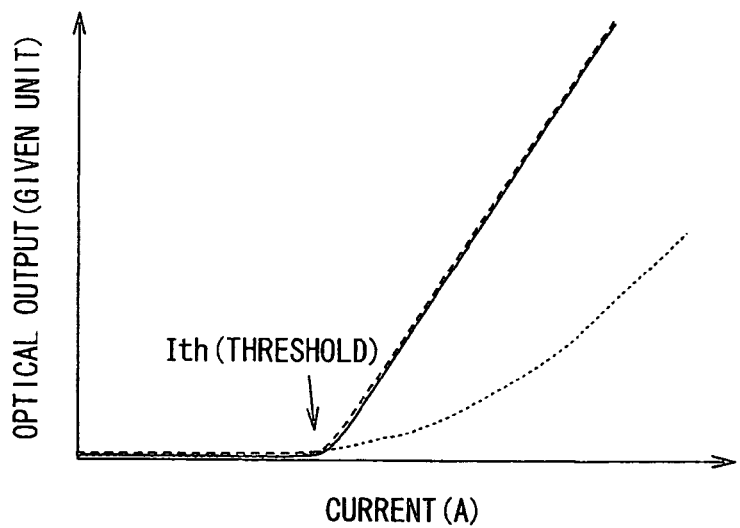
FIG. 3 is a view showing differences of L-I characteristics depending on presence of return light and entering positions in the laser diode shown in FIG. 1.
Figure 4A:
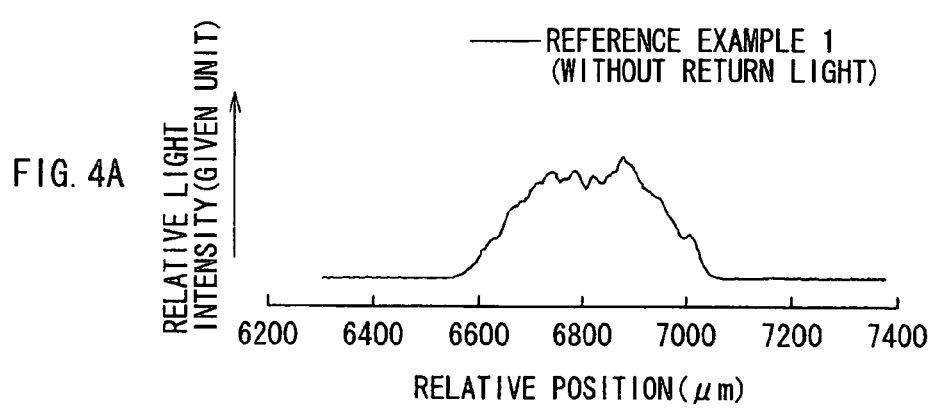
FIGS. 4A, 4B and 4C are views showing differences of profiles depending on presence of return light and entering positions in the laser diode shown in FIG. 1.
Figure 4B:
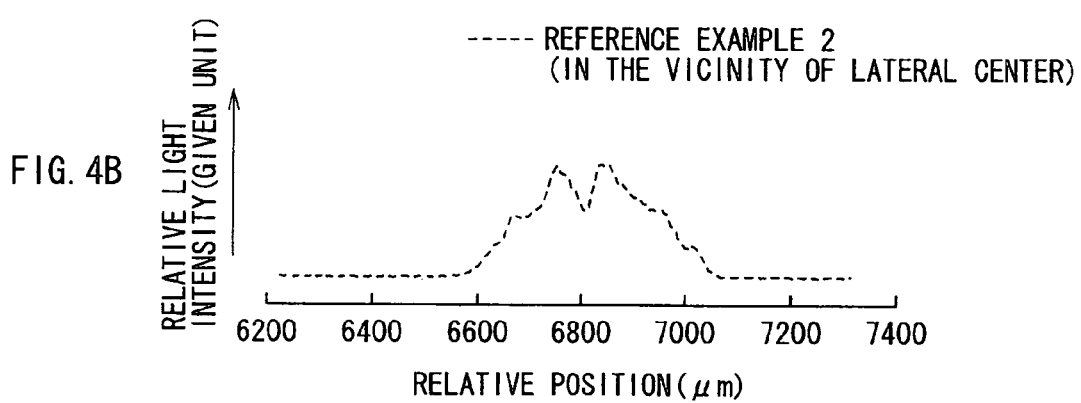
Figure 4C:
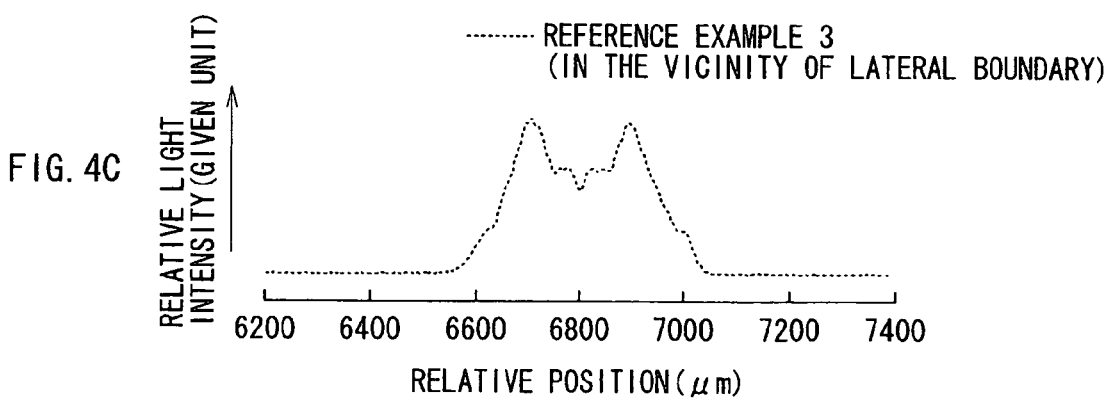

A GaAs broad area type laser diode as shown in FIG. 1 was fabricated. The broad area type laser diode had a general structure as follows. On a substrate 110, a laminated structure including an n-type semiconductor layer 120, an active layer 130 having a light emitting region 131 having a width of 10 µm or more, and a p-type semiconductor layer 140 was provided. On the surface of the p-type semiconductor layer 140, a projecting part (ridge) 150, which is extended in the resonator direction A and a buried layer 160 on the both sides thereof were provided. Thicknesses and component materials of the respective layers were commonly used thicknesses and component materials. A planar shape of the light emitting region 131 was a rectangle as a shaded portion shown in FIG. 2. A width Wef in a main-emitting-side end face 111 was equal to a width Wer in an opposite-side end face 112 (Wef=Wer).

Regarding the obtained broad area laser diode, the case without return light (reference example 1), the case, in which return light entered in the vicinity of a lateral center 131A of the light emitting region 131 (reference example 2), and the case, in which return light entered in the vicinity of lateral boundaries 131B and 131C of the light emitting region 131 (reference example 3) were examined in terms of L-I (light output-current) characteristics and profiles (spatial distributions of light intensity), respectively. The results thereof are shown in FIGS. 3, 4A, 4B, and 4C.

(Results)

As evidenced by FIGS. 3, 4A, 4B, and 4C, in the case, in which return light entered in the vicinity of the lateral center 131A of the light emitting region 131 (reference example 2), results almost equal to the case without return light (reference example 1) were obtained both for the L-I characteristics and the profile. Meanwhile, in the case, in which return light entered in the vicinity of the lateral boundaries 131B and 131C of the light emitting region 131 (reference example 3), the optical output was lowered down to about half of the optical output of the case without return light (reference example 1), and the profile was significantly jumbled and became in the shape of twin peaks.

(Analysis of Results)

As above, it was found that effects of return light on laser oscillation varied according to entering positions of return light in the light emitting region 131, and more major effects were given in the case that return light entered in the vicinity of the lateral boundaries 131B and 131C, rather than the case that return light entered in the vicinity of the lateral center 131A of the light emitting region 131. It is thinkable that one of the reasons thereof is as follows. In the vicinity of the lateral boundaries 131B and 131C of the light emitting region 131, in addition to light containment by a laminated structure in the vertical direction (direction perpendicular to the PN junction), light containment by the lateral boundaries 131B and 131C in the horizontal direction (direction parallel to the PN junction) also exists. Therefore, the state of light waveguide differs from in other regions, such as, in the vicinity of the lateral center 131A. It is thinkable that such difference in structure is related to the fact that disturbance of resonance by return light in the vicinity of the lateral boundaries 131B and 131C became significant compared to in the vicinity of the lateral center 131A.

That is, it can be expected that, if return light is inhibited from approaching or entering in the vicinity of the lateral boundaries 131B and 131C of the light emitting region 131 by providing a return light inhibition part in the main-emitting-side end face 111, a laser diode less subject to effects of return light is to be realized (first and third to fifth embodiments). Otherwise, it is thinkable that, if an light intensity distribution in the light emitting region 131 in the vicinity of the lateral boundaries 131B and 131C is set smaller than in the vicinity of the lateral center 131A by providing a return light inhibition part in the main-emitting-side end face 11, a probability of coupling (interaction) between return light and light inside the light emitting region 131 can be decreased, and a laser diode less subject to effects of return light can be obtained (second embodiment).

Specific embodiments (first to fifth embodiments) will be hereinafter described based on these experiment results and the analysis thereof.

First Embodiment

Figure 5:
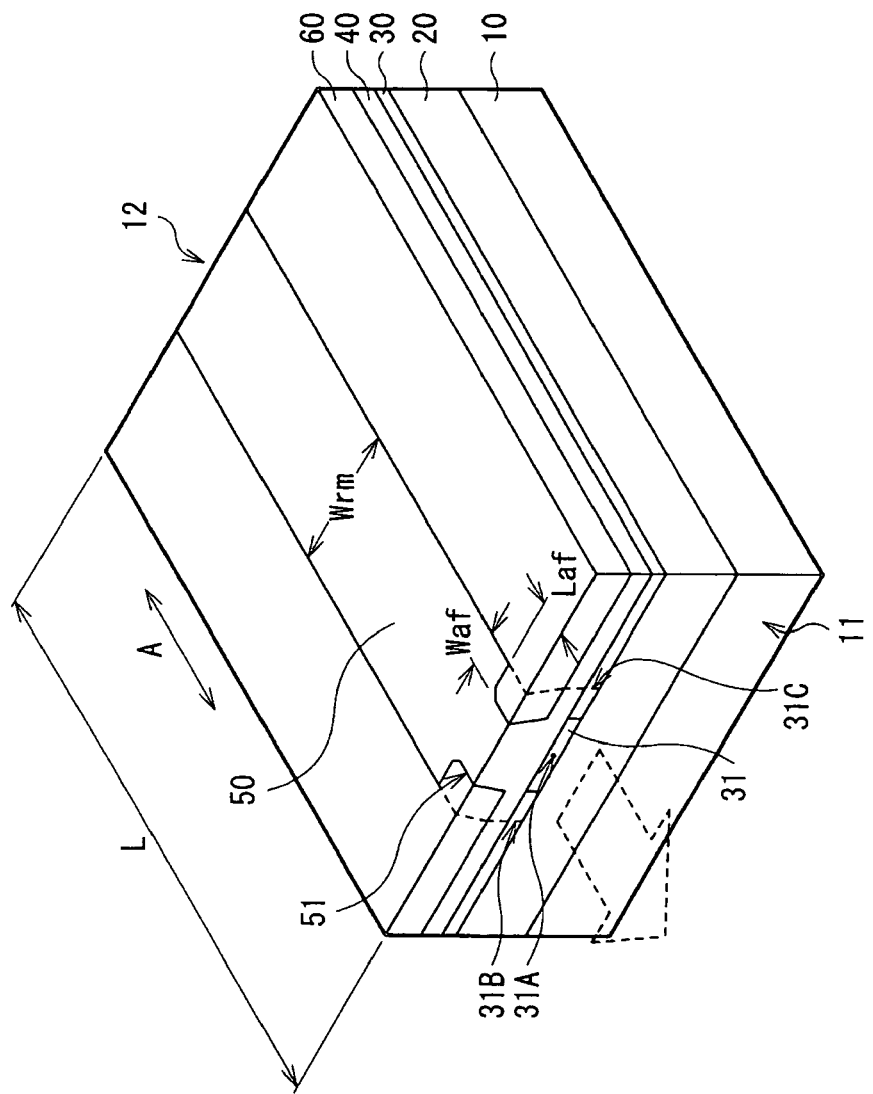
FIG. 5 is a perspective view showing a construction of a laser diode according to a first embodiment of the invention.
Figure 6:
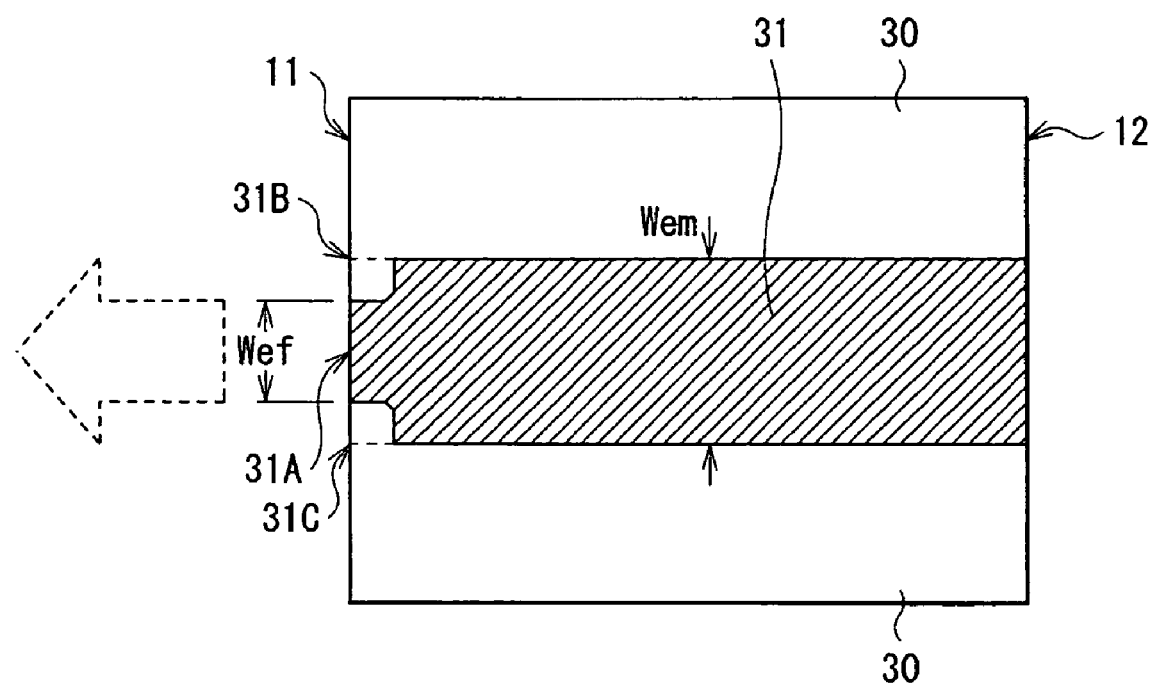
FIG. 6 is a plan view showing a pattern diagram of a shape of a light emitting region of the laser diode shown in FIG. 5.

FIG. 5 shows a construction of a laser diode according to the first embodiment of the invention. FIG. 6 shows a planar shape of a light emitting region (shaded portion) of the laser diode shown in FIG. 5. The laser diode has a laminated structure including, for example, an n-type semiconductor layer 20, an active layer 30, and a p-type semiconductor layer 40 on a substrate 10. On the surface of the p-type semiconductor layer 40, a projecting part 50 for current confinement, which is extended in the resonator direction A is provided and a buried layer 60 is formed on the both sides thereof.

Further, in the laser diode, a main-emitting-side end face 11 and an opposite-side end face 12, which are opposed in the resonator direction A are a pair of resonator end faces. On the main-emitting-side end face 11 and the opposite-side end face 12, a reflector film (not shown) is formed. The reflector film on the main-emitting-side end face 11 is adjusted to have low reflectance, and the reflector film on the opposite-side end face 12 is adjusted to have high reflectance. Thereby, light generated in the active layer 30 travels between the pair of reflector films to be amplified, and is emitted as laser beams from the reflector film on the main-emitting-side end face 11.

The substrate 10 is, for example, a thin film having a thickness of about 100 μm and made of n-type GaAs, to which an n-type impurity such as silicon (Si) is doped. The n-type semiconductor layer 20 has, for example, a thickness of 3 μm, and has an n-type cladding layer (not shown) made of an n-type AlGaAs mixed crystal, to which an n-type impurity such as silicon is doped.

The active layer 30 has, for example, a thickness of 30 nm, and is made of an AlGaAs mixed crystal, to which no impurity is doped. A central part of the active layer 30 is a light emitting region 31, in which light emitting is generated by current injection through the projecting part 50. A width Wem of the light emitting region 31 in the vicinity of the center between the main-emitting-side end face 11 and the opposite-side end face 12 (hereinafter referred to as "width Wem") is, for example, 10 μm or more. That is, this laser diode is a broad area type laser diode.

The p-type semiconductor layer 40 has a construction, in which, for example, a p-type cladding layer and a p-side contact layer (not shown either) are sequentially laminated from the substrate 10 side. The p-type cladding layer has, for example, a thickness of 2 μm, and is made of a p AlGaAs mixed crystal, to which a p-type impurity such as zinc (Zn) is doped. The p-side contact layer has, for example, a thickness of 1 μm, and is made of p GaAs, to which a p-type impurity such as zinc (Zn) is doped.

In a pair of corners of the projecting part 50 in the main-emitting-side end face 11, notch parts 51 are provided. Thereby, in the laser diode, a width Wef of the light emitting region 31 in the vicinity of the main-emitting-side end face 11 and the width Wem of the light emitting region 31 in the vicinity of the center between the main-emitting-side end face 11 and the opposite-side end face 12 satisfy a relation of Wef<Wem. Therefore, in the vicinity of lateral boundaries 31B and 31C of the light emitting region 31, light emitting is not generated, and even if return light approaches or enters, the effects thereof can be inhibited. The notch 51 corresponds to one specific example of the return light inhibition parts in the invention.

A width Waf of the notch part 51 is preferably, for example, 1% to 20% of a width Wrm of the projecting part 50 in the vicinity of the center between the main-emitting-side end face 11 and the opposite-side end face 12. When this value is too large, an effective width of the resonator becomes small (narrow), and therefore, sufficient output may not be obtained. A length Laf of the notch part 51 is preferably, for example, 0.1% to 20% of a length L of the projecting part 50 in the resonator direction A.

A shape of the notch part 51 is not limited to the step-like shape as shown in FIG. 5, but may be a tapered shape or a curved shape.

The buried layer 60 is made of, for example, n-type GaAs.

On the p-type semiconductor layer 40 and the buried layer 60, a p-side electrode (not shown) is provided. The p-side electrode has a structure, in which, for example, a titanium (Ti) layer, a platinum (Pt) layer, and a gold (Au) layer are sequentially laminated from the p-type semiconductor layer 40 side, and the lamination is alloyed by heat treatment. The p-side electrode is electrically connected to the p-type semiconductor layer 40. Meanwhile, on the rear face side of the substrate 10, an n-side electrode (not shown) is formed. The n-side electrode has a structure, in which, for example, an alloy layer of gold and germanium (Ga), a nickel (Ni) layer, and a gold (Au) layer are sequentially laminated from the substrate 10 side, and the lamination is alloyed by heat treatment. The n-side electrode is electrically connected to the n-type semiconductor layer 20 with the substrate 10 inbetween.

This laser diode can be manufactured, for example, as follows.

Figure 7A:
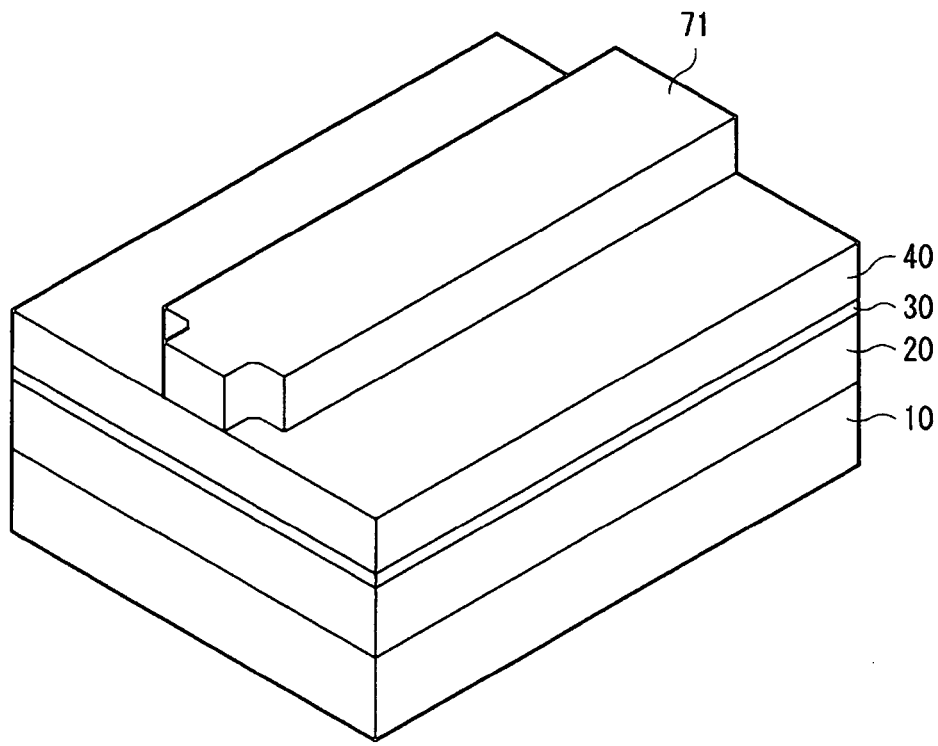
FIGS. 7A and 7B are perspective views showing the steps of manufacturing the laser diode shown in FIG. 5.
Figure 7B:
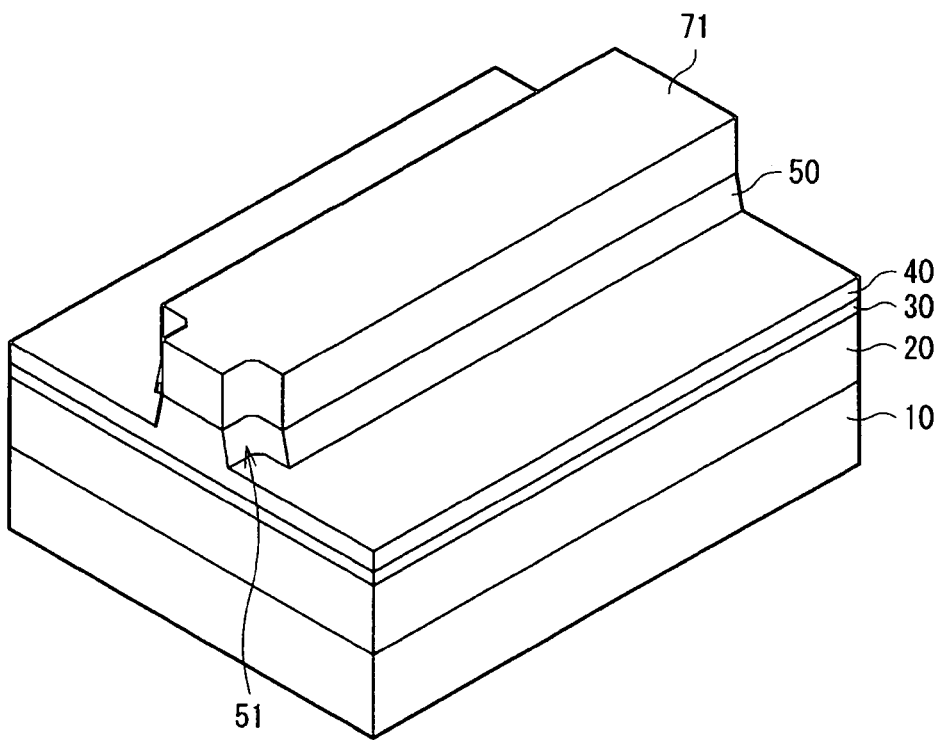

FIGS. 7A and 7B show a method of manufacturing the laser diode in the order of steps. First, as shown in FIG. 7A, for example, over the substrate 10 made of the foregoing material, the n-type semiconductor layer 20, the active layer 30, and the p-type semiconductor layer 40 having the foregoing thicknesses and materials are sequentially laminated by MOCVD (Metal Organic Chemical Vapor Deposition) method.

Next, as shown in FIG. 7A similarly, for example, on the p-type semiconductor layer 40, a resist film (not shown) is formed, and a mask layer 71 to form the projecting part 51 is formed by, for example, lithography technique.

Subsequently, as shown in FIG. 7B, part of the p-type semiconductor layer 40 in the thickness direction is selectively removed by, for example, dry etching by using the mask layer 71 to form the projecting part 50 having the notch part 51. After that, the mask layer 71 is removed.

After the projecting part 50 is formed, for example, as shown in FIG. 5, the buried layer 60 made of the foregoing material is formed on the both sides of the projecting part 50. After the buried layer 60 is formed, the rear face side of the substrate 10 is lapped to obtain a thin film having the foregoing thickness, on which an alloy layer of gold and germanium, a nickel layer, and a gold layer are sequentially vapor-deposited. After that, heat treatment is provided to form the n-side electrode. Further, on the projecting part 50 of the p-type semiconductor layer 40 and the buried layer 60, for example, a titanium layer, a platinum layer, and a gold layer are sequentially vapor-deposited. Further, heat treatment is provided to form the p-side electrode.

After the n-side electrode and the p-side electrode are formed, the substrate 10 is adjusted to a given size, and the reflector films (not shown) are formed on the main-emitting-side end face 11 and the opposite-side end face 12. Thereby, the laser diode shown in FIG. 5 is formed.

In the laser diode, when a given voltage is applied between the n-side electrode and the p-side electrode, a driving current supplied from the p-side electrode is current-confined by the projecting part 50, and then injected into the light emitting region 31 of the active layer 30. Then, light emitting is generated by electron-hole recombination. The light is reflected by the pair of reflector films (not shown), travels between them, generates laser oscillation, and is emitted outside as laser beams. Since the notch parts 51 are provided in the pair of corners of the projecting part 50 in the main-emitting-side end face 11, light emitting is not generated in the vicinity of the lateral boundaries 31B and 31C of the light emitting region 31. Therefore, even if return light approaches or enters, the effects thereof can be inhibited.

As above, in this embodiment, since the notch parts 51 are provided in the pair of corners of the projecting part 50 in the main-emitting-side end face 11, light emitting is not generated in the vicinity of the lateral boundaries 31B and 31C of the light emitting region 31. Therefore, even if return light approaches or enters, the effects thereof can be inhibited.

In this embodiment, the case that the notch parts 51 are provided in the both corners of the projecting part 50 in the main-emitting-side end face 11 has been described. However, the notch part 51 can be provided in only one corner. Further, the notch part 51 can be provided not only in the main-emitting-side end face 11, but also in the opposite-side end face 12.

Second Embodiment

Figure 8:
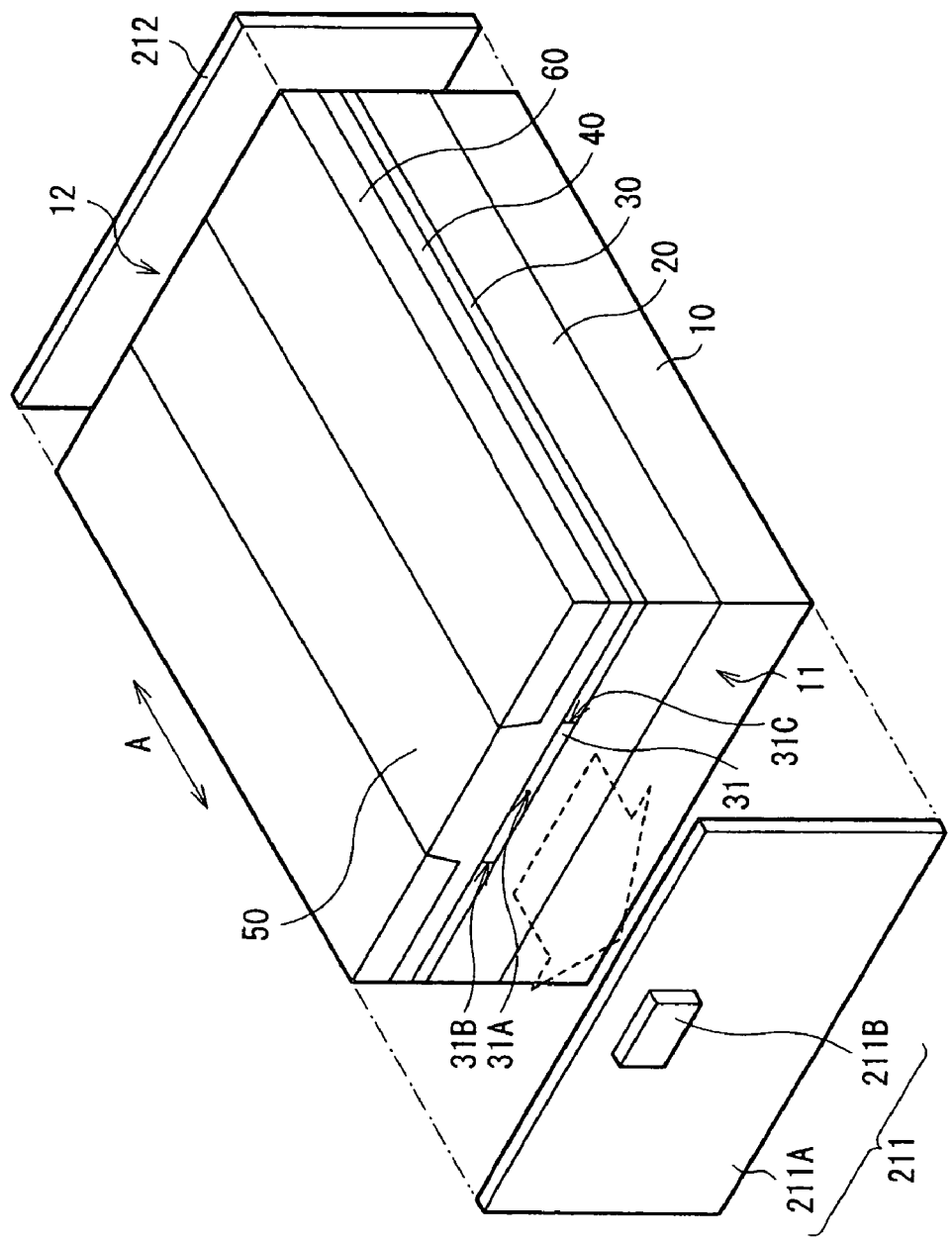
FIG. 8 is a perspective view showing a construction of a laser diode according to a second embodiment of the invention.
Figure 9A:
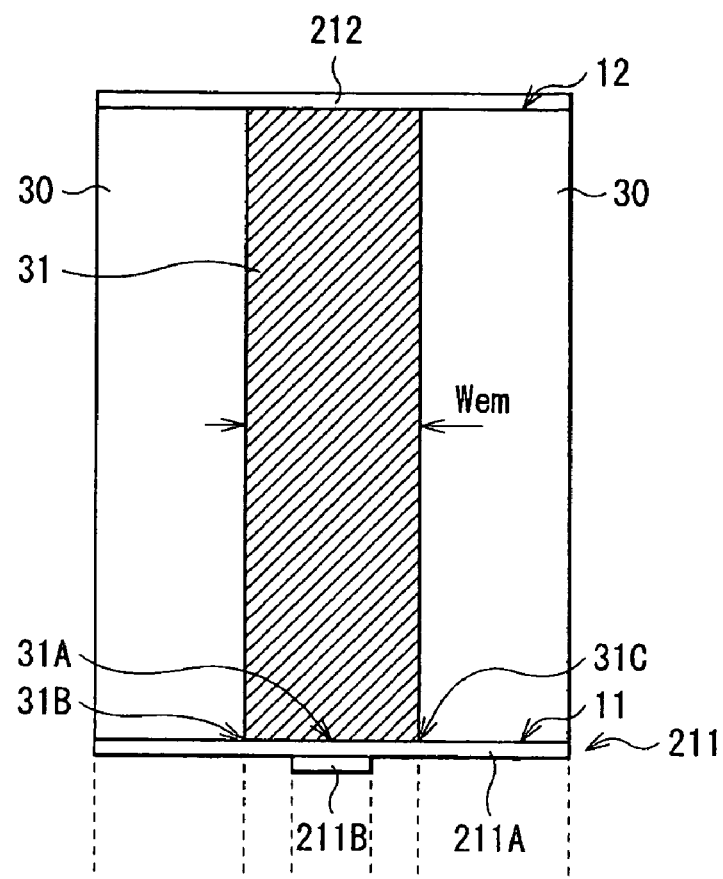
FIG. 9A is a plan view showing a pattern diagram of a shape of a light emitting region of the laser diode shown in FIG. 8.
Figure 9B:
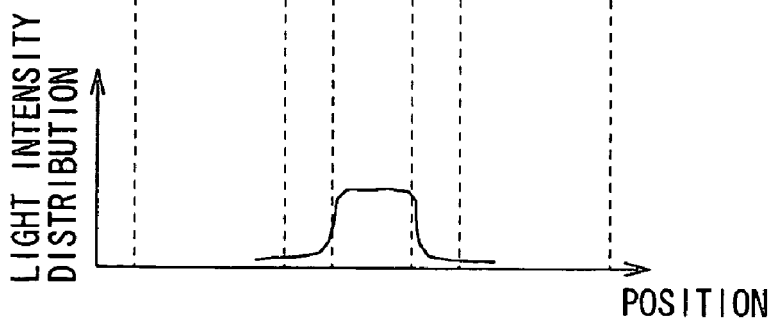
FIG. 9B is a view showing a reflectance distribution in the lateral direction of a main-emitting-side end face.
Figure 9C:
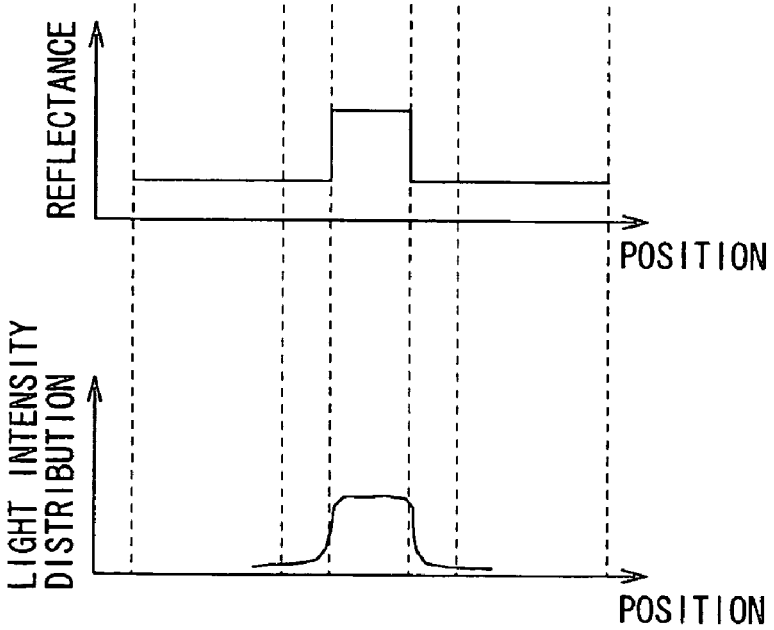
FIG. 9C is a view showing a light power distribution in the lateral direction of the main-emitting-side end face.

FIG. 8 shows a construction of a laser diode according to the second embodiment of the invention. FIGS. 9A, 9B, and 9C show a planar shape of a light emitting region (shaded portion) of the laser diode shown in FIG. 8, a reflectance distribution in the main-emitting-side end face, and a light power distribution inside the light emitting region. The laser diode has the same construction as of the laser diode of the first embodiment, except that a first reflector film 211 is included in the main-emitting-side end face 11, and in the first reflector film 211, laser light reflectance to the vicinity of the lateral center 31A of the light emitting region 31 is set higher than laser light reflectance to the vicinity of the lateral boundaries 31B and 31C. Therefore, descriptions will be given by giving the same reference symbols to the corresponding components.

The first reflector film 211 has a construction, in which, for example, a second coating layer 211B covering the vicinity of a lateral center 31A of the light emitting region 31 is provided on a first coating layer 211A covering the whole area of the main-emitting-side end face 11. The first coating layer 211A and the second coating layer 211B are made of, for example, aluminum oxide. The thicknesses thereof are desirably adjusted according to target reflectance or oscillation wavelengths. For example, the reflectance of the first coating layer 211A is 10%, and reflectance of the second coating layer 211B is 10%. In this case, reflectance to the vicinity of the lateral center 31A of the light emitting region 31 where the first coating layer 211A and the second coating layer 211B are overlapped is, for example, 19%, and reflectance in other region where only the first coating layer 211A is formed is 10%. The first reflector film 211 corresponds to one specific example of the return light inhibition parts in the invention.

As above, in this laser diode, in the main-emitting-side end face 11, the first reflector film 211 is provided and in the first reflector film 211, the laser light reflectance (19%) to the vicinity of the lateral center 31A of the light emitting region 31 is set higher than the laser light reflectance (10%) to the vicinity of the lateral boundaries 31B and 31C. Thereby, in this laser diode, it is possible to adjust the light power distribution in the light emitting region 31 larger in the vicinity of the lateral center 31A, and smaller in the vicinity of the lateral boundaries 31B and 31C. Therefore, even if return light approaches or enters in the vicinity of the lateral boundaries 31B and 31C of the light emitting region 31, an absolute amount of light coupling with (interacting with) return light is decreased, and effects of return light can be effectively inhibited.

The laser light reflectance to the vicinity of the lateral center 31A of the light emitting region 31 is preferably, for example, 15% to 40%, and the laser light reflectance to the vicinity of the lateral boundaries 31B and 31C is preferably, for example, 5% to 20%. When such reflectance is too large, a rate of light confined inside the light emitting region 31 becomes high, light becomes hard to be emitted from the main-emitting-side end face 11, and therefore, sufficient output may not be obtained.

Further, a difference between the laser light reflectance to the vicinity of the lateral center 31A and the laser light reflectance to the vicinity of the lateral boundaries 31B and 31C of the light emitting region 31 is preferably, for example, 5% to 30%. When this difference is too large, the light power distribution in the vicinity of the lateral center 31A of the light emitting region 31 becomes too large, and therefore, end face deterioration may occur in the vicinity of the lateral center 31A.

A width Wcf of the second coating layer 211B, that is, a width of the region, in which the laser light reflectance to the vicinity of the lateral center 31A of the light emitting region 31 is set relatively high is preferably 20% to 80% of the width Wem of the light emitting region 31 in the vicinity of the center between the main-emitting-side end face 11 and the opposite-side end face 12.

The second reflector film 212 is formed on the opposite-side end face 12. The second reflector film 212 is constructed by, for example, alternately laminating an aluminum oxide layer and an amorphous silicon layer, and is adjusted to have high reflectance. Thereby, light generated in the active layer 30 travels between the first reflector film 211 and the second reflector film 212, is amplified, and is emitted as laser beams from the first reflector film 211.

This laser diode can be manufactured, for example, as follows.

First, as in the first embodiment, over the substrate 10, the n-type semiconductor layer 20, the active layer 30, and the p-type semiconductor layer 40 are sequentially laminated by, for example, MOCVD method.

Next, on the p-type semiconductor layer 40, a resist film (not shown) is formed, and a mask layer (not shown) to form the projecting part 50 is formed by, for example, lithography technique. Subsequently, part of the p-type semiconductor layer 40 in the thickness direction is selectively removed by, for example, dry etching by using the mask layer to form the projecting part 50. After that, the mask layer is removed, and the buried layer 60 made of the foregoing material is formed on the both sides of the projecting part 50 by, for example, MOCVD method.

After the buried layer 60 is formed, the rear face side of the substrate 10 is lapped to obtain a thin film having the foregoing thickness. The n-side electrode and the p-side electrode are formed as in the first embodiment.

After the n-side electrode and the p-side electrode are formed, the substrate 10 is adjusted to a given size. On the main-emitting-side end face 11, the first coating layer 211A and the second coating layer 211B made of the foregoing materials and having the foregoing reflectance are laminated to form the first reflector film 211. Then, the second coating layer 211B is formed only in the vicinity of the lateral center 31A of the light emitting region 31. Further, the second reflector film 212 is formed on the opposite-side end face 12. Thereby, the laser diode shown in FIG. 8 is formed.

In this laser diode, when a given voltage is applied between the n-side electrode and the p-side electrode, a driving current supplied from the p-side electrode is current-confined by the projecting part 50, and then injected into the light emitting region 31 of the active layer 30. Then, light emitting is generated by electron-hole recombination. The light is reflected by the first reflector film 211 and the second reflector film 212, travels between them, generates laser oscillation, and is emitted outside as laser beams. Then, in the first reflector film 211 provided on the main-emitting-side end face 11, the laser light reflectance to the vicinity of the lateral center 31A of the light emitting region 31 is set higher than the laser light reflectance to the vicinity of the lateral boundaries 31B and 31C. Therefore, the light power distribution inside the light emitting region 31 is larger in the vicinity of the lateral center 31A, and smaller in the vicinity of the lateral boundaries 31B and 31C. Consequently, even if return light approaches or enters in the vicinity of the lateral boundaries 31B and 31C of the light emitting region 31, the absolute amount of light coupling with (interacting with) return light is decreased, and the effects of return light can be effectively inhibited.

As above, in this embodiment, the first reflector film 211 is provided in the main-emitting-side end face 11, and in the first reflector film 211, the laser light reflectance to the vicinity of the lateral center 31A of the light emitting region 31 is set higher than the laser light reflectance to the vicinity of the lateral boundaries 31B and 31C. Therefore, the light power in the lateral boundaries 31B and 31C of the light emitting region 31 is decreased. Then, even if return light approaches or enters, the absolute amount of light coupling with (interacting with) the return light can be decreased. Consequently, the effects of return light can be effectively inhibited.

Third Embodiment

Figure 10:
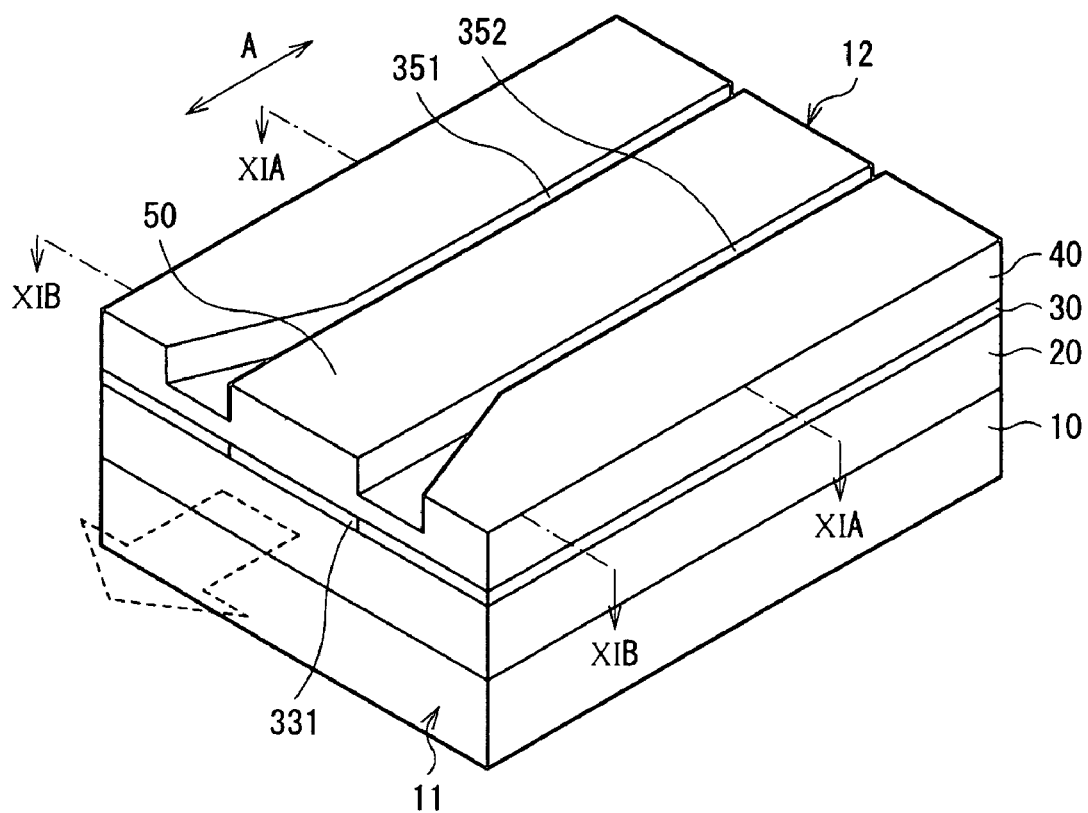
FIG. 10 is a perspective view showing a construction of a laser diode according to a third embodiment of the invention.
Figure 11A:
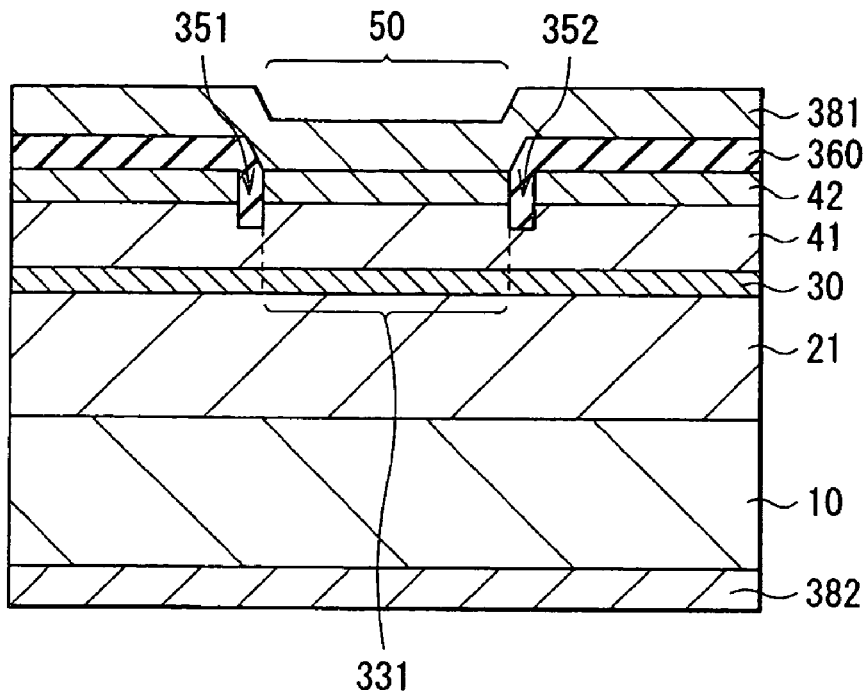
FIG. 11A is a cross section showing a cross section structure taken along line XIA-XIA of FIG. 10.
Figure 11B:
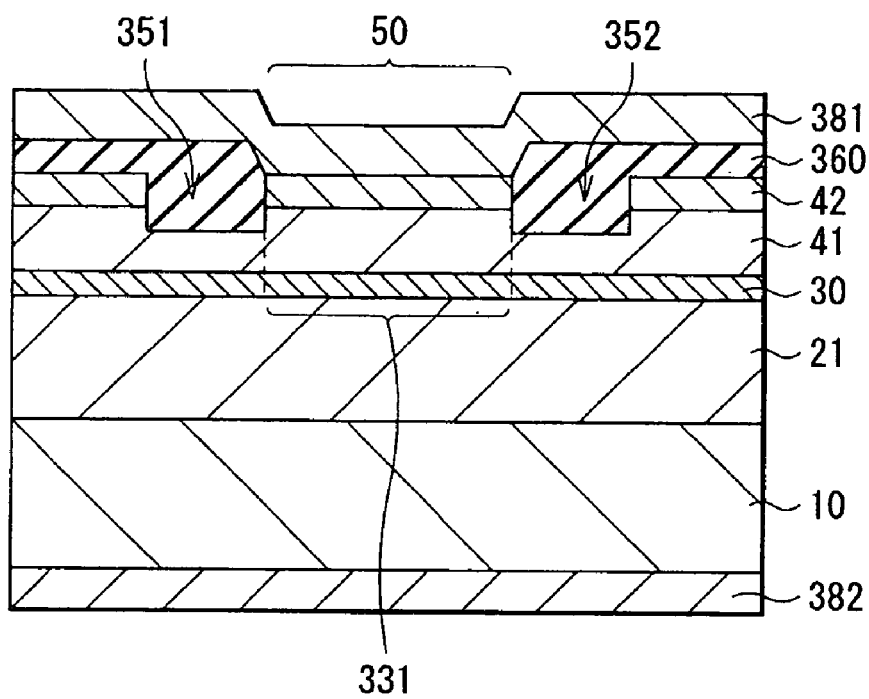
FIG. 11B is a cross section showing a cross section structure taken along line XIB-XIB of FIG. 10.

FIG. 10 shows a construction of a laser diode according to the third embodiment of the invention. FIG. 11A shows a cross section structure taken along line XIA-XIA of FIG. 10, and FIG. 11B shows a cross section structure taken along line XIB-XIB of FIG. 10. The laser diode has the same construction as of the laser diode of the first embodiment, except that, for example, two groove-like concave parts 351 and 352, which are extended in the resonator direction A are provided on the surface of the p-type semiconductor layer 40, and a part surrounded by the groove-like concave parts 351 and 352 of the p-type semiconductor layer 40 is the projecting part 50. Therefore, descriptions will be given by giving the same reference symbols to the corresponding components.

The n-type semiconductor layer 20 has, for example, an n-type cladding layer 21. The central part of the active layer 30 is a structural light emitting region 331 defined by the projecting part 50. The p-type semiconductor layer 40 has, for example, a p-type cladding layer 41 and a p-side contact layer 42. The n-type cladding layer 21, the p-type cladding layer 41, and the p-side contact layer 42 are constructed as in the first embodiment.

In the groove-like concave parts 351 and 352, and on the surface of the p-type semiconductor layer 40 except for the projecting part 50, an insulating layer 360 is formed. The insulating layer 360 has, for example, a thickness of 3 μm, and is made of silicon dioxide ($SiO_2$).

On the p-type semiconductor layer 40 in the projecting part 50 and on the insulating layer 360, a p-side electrode 381 is provided. Meanwhile, an n-side electrode 382 is formed on the rear face side of the substrate 10. The p-side electrode 381 and the n-side electrode 382 are constructed as in the first embodiment.

Figure 12A:
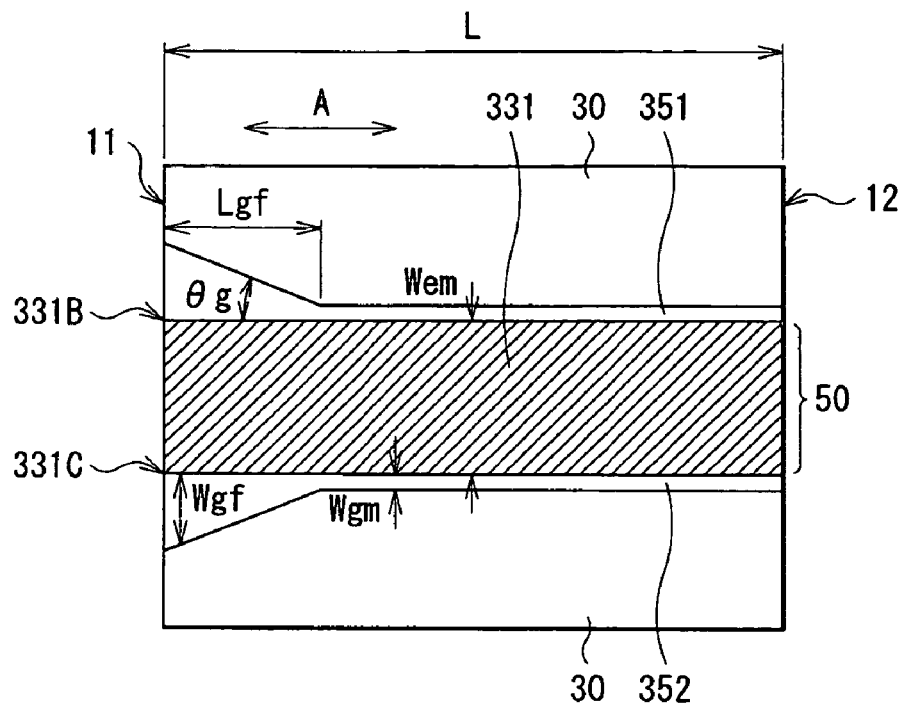
FIG. 12A is a plan view showing a pattern diagram of a position relation between a projecting part and a structural light emitting region of the laser diode shown in FIG. 10.

FIG. 12A schematically shows a planar position relation between the projecting part 50 surrounded by the groove-like concave parts 351 and 352 and the structural light emitting region 331 (shaded portion) shown in FIG. 10. The width of the projecting part 50 shall be uniform, and the width Wem of the structural light emitting region 331 shall be uniform.

Figure 12B:
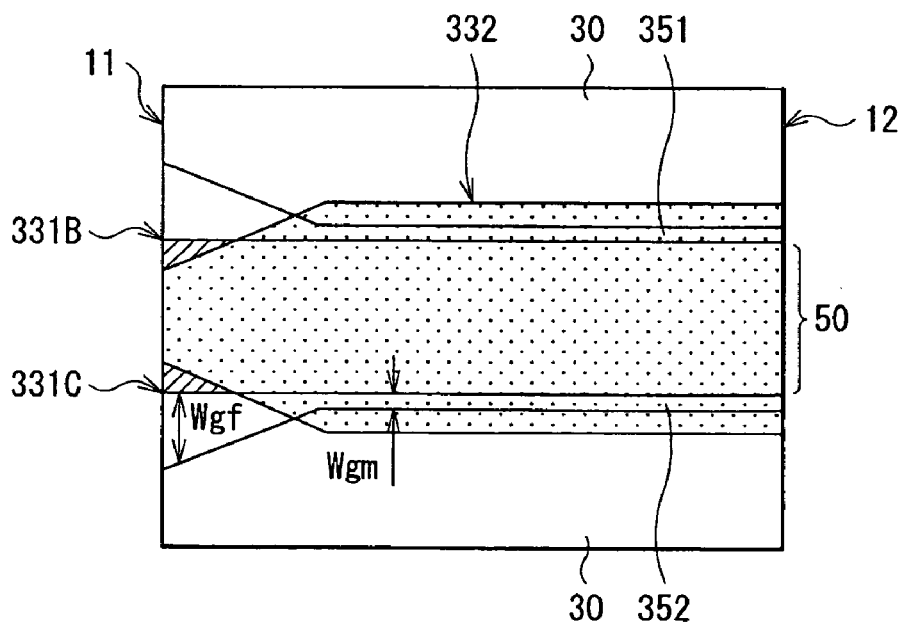
FIG. 12B is a plan view showing an effective light emitting region additionally to FIG. 12A.

FIG. 12B is a view, in which an effective light emitting region (half-tone dot meshed portion) is further added to FIG. 12A. A width Wgf of the groove-like concave parts 351 and 352 in the vicinity of the main-emitting-side end face 11 is larger than a width Wgm in the vicinity of the center between the main-emitting-side end face 11 and the opposite-side end face 12. Thereby, in the laser diode, index guide characteristics in the vicinity of the main-emitting-side end face 11 are enhanced to narrow the width of the effective light emitting region 332. Therefore, even if return light approaches in the vicinity of lateral boundaries 331B and 331C of the structural light emitting region 331, the light is hard to enter in the effective light emitting region 332.

Allowing the width of the effective light emitting region 332 in the vicinity of the main-emitting-side end face 11 to be narrowed is enabled by utilizing the fact that effects on the effective refractive index difference between the projecting part 50 of the p-type semiconductor layer 40 and outside parts thereof becomes variable since the width Wgf of the groove-like concave parts 351 and 352 in the vicinity of the main-emitting-side end face 11 is widened. That is, in the vicinity of the center between the main-emitting-side end face 11 and the opposite-side end face 12, since the width Wgm of the groove-like concave parts 351 and 352 is narrow, the refractive index difference between the projecting part 50 and the outside parts thereof is small. Therefore, the gain guide characteristics are enhanced, and the effective light emitting region 332 becomes in a slightly laterally widened state compared to the structural light emitting region 331. Meanwhile, in the vicinity of the main-emitting-side end face 11, the width Wgf of the groove-like concave parts 351 and 352 is wide, and therefore, the refractive index difference between the projecting part 50 and the outside parts thereof is large. Therefore, the index guide characteristics are enhanced, and the width of the effective light emitting region 332 becomes narrower than of the structural light emitting region 331. Consequently, as described above, even if return light approaches the lateral boundaries 331B and 331C of the structural light emitting region 331, the return light is hard to enter in the effective light emitting region 332.

Changes of the width of the effective light emitting region 332 vary according to changes of the width of the groove-like concave parts 351 and 352. For example, as shown in FIGS. 12A and 12B, when the groove-like concave parts 351 and 352 are widened in the shape of a taper toward the main-emitting-side end face 11, a transition region, in which light confinement is gradually intensified toward the main-emitting-side end face 11 is formed in the effective light emitting region 332. Further, the shape of the groove-like concave parts 351 and 352 is not limited to the tapered shape as shown in FIGS. 12A and 12B, but can be a step-like shape or a curved shape.

The width Wgf of the groove-like concave parts 351 and 352 in the vicinity of the main-emitting-side end face 11 is preferably 0.1% to 10% of the width Wem of the structural light emitting region 331. When this value is too small, the index guide characteristics in the vicinity of the main-emitting-side end face 11 may not be sufficiently obtained, and therefore, effects become small. Meanwhile, when this value is too large, the refraction difference between the projecting part 50 and the outside parts thereof in the vicinity of the main-emitting-side end face 11 becomes too large, and therefore, effects such as disturbance of light emitting mode may occur.

A length Lgf in the part where the width Wgf is set larger than the width Wgm of the groove-like concave parts 351 and 352 is preferably 1% to 50% of the length L of the groove-like concave parts 351 and 352 in the resonator direction A. When the length Lgf is less than 1%, the part with the narrowed width of the effective light emitting region 332 is small, and therefore, effects are not sufficient. Meanwhile, when the length Lgf is more than 50%, changes in the width of the effective light emitting region 332 becomes too modest, and therefore, sufficient effects may not be obtained.

Further, when the groove-like concave parts 351 and 352 are in the shape of a taper as shown in FIGS. 12A and 12B, an angle θg in the part where the width Wgf is set larger than the width Wgm is preferably, for example, 0.3° to 20°. When the angle θg is too small, changes in the width of the effective light emitting region 322 are too modest, and therefore, effects are not sufficient. Meanwhile, when the angle θg is too large, the refractive index difference between the projecting part 50 and the outside parts thereof in the vicinity of the main-emitting-side end face 11 becomes too large, and therefore, effects such as disturbance of the light emitting mode may be caused.

This laser diode can be manufactured, for example, as follows.

First, for example, as in the first embodiment, over the substrate 10, the n-type semiconductor layer 20, the active layer 30, and the p-type semiconductor layer 40 are sequentially laminated by, MOCVD method.

Next, on the p-type semiconductor layer 40, a resist film (not shown) is formed, and a mask layer (not shown) to form the groove-like concave parts 351 and 352 is formed by, for example, lithography technique. Subsequently, the p-type semiconductor layer 40 is selectively removed by, for example, dry etching by using the mask layer to form the groove-like concave parts 351 and 352. Then, the mask layer is removed.

After that, for example, by vapor deposition method and lithography technique, the insulating layer 360 made of the foregoing material is formed in the groove-like concave parts 351 and 352 and on the surface of the p-type semiconductor layer 40 except for the projecting part 50.

After the insulating layer 360 is formed, the rear face side of the substrate 10 is lapped to obtain a thin film having the foregoing thickness. The n-side electrode 382 and the p-side electrode 381 are formed as in the first embodiment.

After the n-side electrode 382 and the p-side electrode 381 are formed, the substrate 10 is adjusted to a given size. On the main-emitting-side end face 11 and the opposite-side end face 12, reflector films (not shown) are formed. Thereby, the laser diode shown in FIG. 10 is formed.

In this laser diode, when a given voltage is applied between the n-side electrode 382 and the p-side electrode 381, a driving current supplied from the p-side electrode 381 is current-confined by the projecting part 50, and then injected into the structural light emitting region 331 of the active layer 30. Then, light emitting is generated by electron-hole recombination. The light is reflected by the pair of reflector films (not shown), travels between them, generates laser oscillation, and is emitted outside as laser beams. Then, the width Wgf of the groove-like concave parts 351 and 352 in the vicinity of the emitting side end face 11 is larger than the width Wgm in the vicinity of the center between the main-emitting-side end face 11 and the opposite-side end face 12. Therefore, the index guide characteristics in the vicinity of the main-emitting-side end face 11 are enhanced, and the width of the effective light emitting region 332 is narrowed. Thereby, even if return light approaches in the vicinity of the lateral boundaries 331B and 331C of the structural light emitting region 331, the return light is hard to enter in the effective light emitting region 332.

As above, in this embodiment, since the width Wgf of the groove-like concave parts 351 and 352 in the vicinity of the main-emitting-side end face 11 is set larger than the width Wgm in the vicinity of the center between the main-emitting-side end face 11 and the opposite-side end face 12. Therefore, the index guide characteristics in the vicinity of the main-emitting-side end face 11 can be enhanced, and the width of the effective light emitting region 332 can be narrowed. As a result, even if return light approaches in the vicinity of the lateral boundaries 331B and 331C of the structural light emitting region 331, the return light is hard to enter in the effective light emitting region 332, and the effects of return light can be effectively inhibited.

Figure 13:
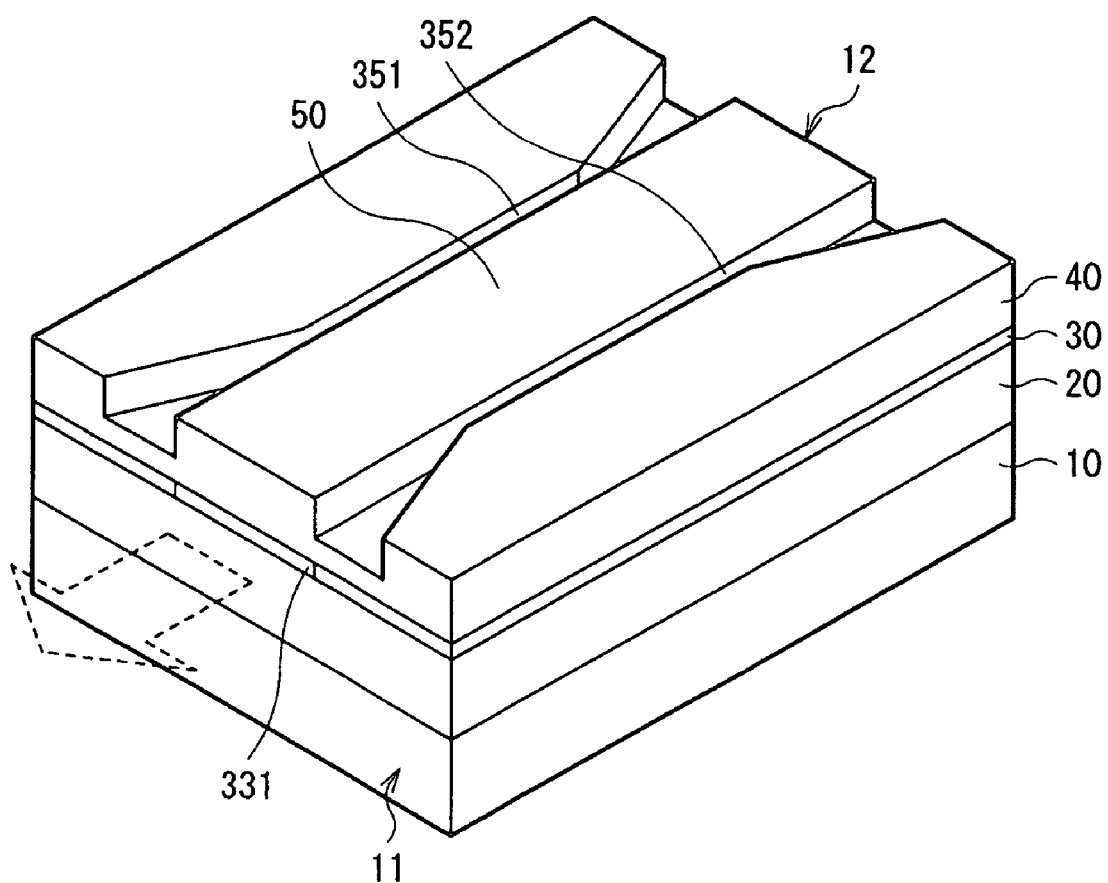
FIG. 13 is a perspective view showing a modification of the laser diode shown in FIG. 10.

In this embodiment, the case, in which the width Wgf of both the groove-like concave parts 351 and 352 in the vicinity of the main-emitting-side end face 11 is widened has been described. However, it is possible to widen the width Wgf of only one groove-like concave part. Further, for example, as shown in FIG. 13, regarding the groove-like concave parts 351 and 352, not only the width Wgf in the vicinity of the main-emitting-side end face 11, but also a width Wgr in the vicinity of the opposite-side end face 12 can be widened.

Further, in this embodiment, the case, in which the insulting layer 360 is buried in the groove-like concave parts 351 and 352 has been described. However, inside of the groove-like concave parts 351 and 352 can be air.

Fourth Embodiment

Figure 14:
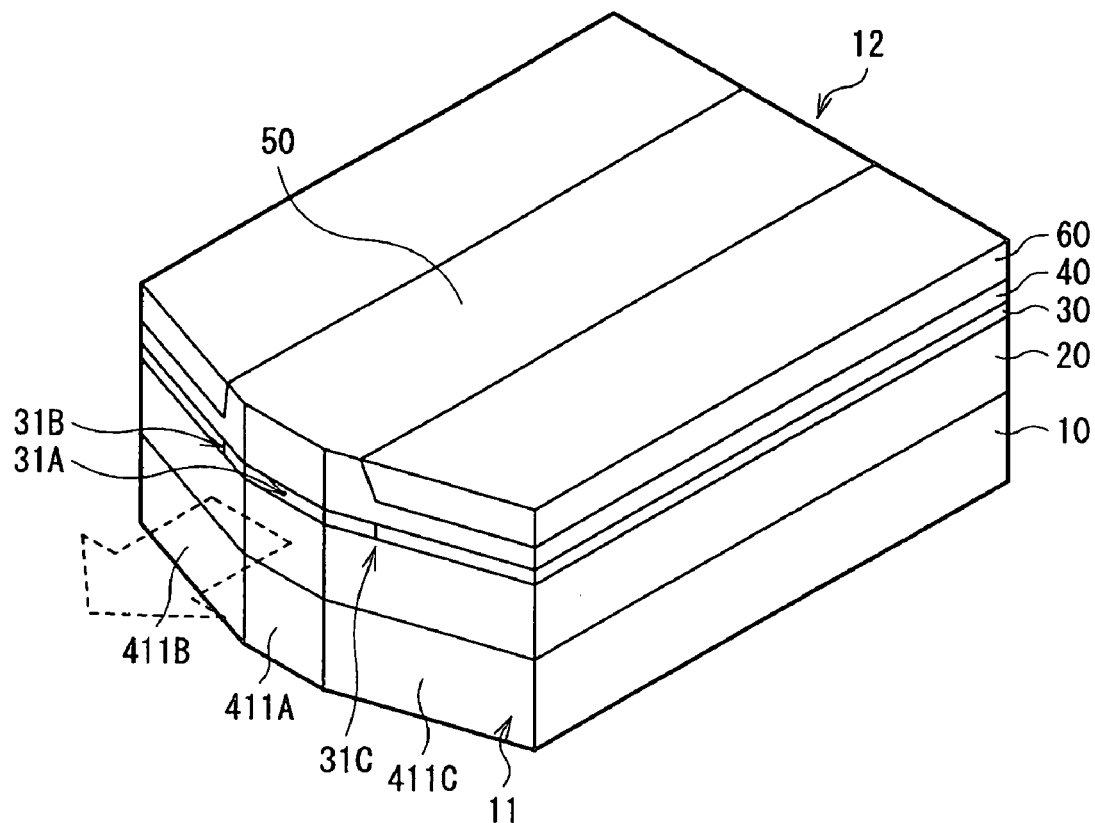
FIG. 14 is a perspective view showing a construction of a laser diode according to a fourth embodiment of the invention.
Figure 15:
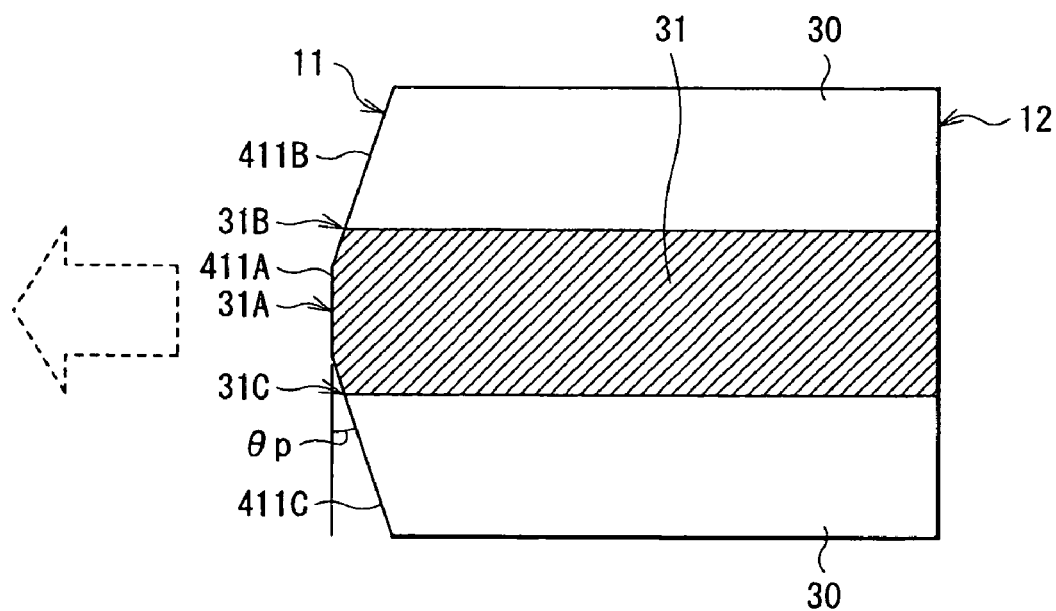
FIG. 15 is a plan view showing a pattern diagram of a shape of a light emitting region of the laser diode shown in FIG. 14.

FIG. 14 shows a construction of a laser diode according to a fourth embodiment of the invention. FIG. 15 shows a planar shape of a light emitting region (shaded portion) of the laser diode shown in FIG. 14. This laser diode has the same construction as of the laser diode of the first embodiment, except that a normal end face 411A and inclined planes 411B and 411C are formed on the main-emitting-side end face 11. Therefore, descriptions will be given by giving the same reference symbols to the corresponding components.

The normal end face 411A includes vicinity of the lateral center 31A of the light emitting region 31, and is parallel to the opposite-side end face 12. Light generated in the light emitting region 31 is emitted in the direction perpendicular to the normal end face 411A.

The inclined planes 411B and 411C include vicinity of the lateral boundaries 31B and 31C of the light emitting region 31, and is inclined to the normal end face 411A. Thereby, in the laser diode, even if return light approaches in the vicinity of the lateral boundaries 31B and 31C of the light emitting region 31, the return light is diagonally reflected by the inclined planes 411B and 411C, and is hard to enter. An oblique angle θp made by the inclined planes 411B, 411C and the normal end face 411A is preferably, for example, 0.1° or more. These inclined planes 411B and 411C correspond to one specific example of the return light inhibition parts in the invention.

This laser diode can be manufactured, for example, as follows.

First, for example, as in the first embodiment, over the substrate 10, the n-type semiconductor layer 20, the active layer 30, and the p-type semiconductor layer 40 are sequentially laminated by, for example, MOCVD method. Then, the projecting part 50 and the buried layer 60 on the both sides thereof are formed.

After the buried layer 60 is formed, the rear face side of the substrate 10 is lapped to obtain a thin film having the foregoing thickness. The n-side electrode and the p-side electrode are formed respectively as in the first embodiment.

After the n-side electrode and the p-side electrode are formed, the substrate 10 is adjusted to a given size. On the main-emitting-side end face 11, the inclined planes 411B and 411C are formed by, for example, etching. The etching method or the conditions can be similar to the etching method or the conditions used for forming the projecting part 50.

After the inclined planes 411B and 411C are formed, reflector films (not shown) are formed on the main-emitting-side end face 11 and the opposite-side end face 12. Thereby, the laser diode shown in FIG. 14 is formed.

In this laser diode, when a given voltage is applied between the n-side electrode and the p-side electrode, a driving current supplied from the p-side electrode is current-confined by the projecting part 50, and then injected into the light emitting region 31 of the active layer 30. Then, light emitting is generated by electron-hole recombination. The light is reflected by the pair of reflector films (not shown), travels between them, generates laser oscillation, and is emitted outside as laser beams. Then, in the main-emitting-side end face 11, the vicinity of the lateral boundaries 31B and 31C of the light emitting region 31 is included in the inclined planes 411B and 411C inclined to the normal end face 411A. Therefore, even if return light approaches in the vicinity of the lateral boundaries 31B and 31C, the return light is reflected by the inclined planes 411B and 411C, and is hard to enter.

As above, in this embodiment, the normal end face 411A, which includes the vicinity of the lateral center 31A of the light emitting region 31 and is parallel to the opposite-side end face 12, and the inclined planes 411B and 411C, which include the vicinity of the lateral boundaries 31B and 31C of the light emitting region 31 and are inclined to the normal end face 411A are formed in the main-emitting-side end face 11. Therefore, even if return light approaches in the vicinity of the lateral boundaries 31B and 31C of the light emitting region 31, the return light is diagonally reflected by the inclined planes 411B and 411C and is hart to enter. As a result, effects of return light can be effectively inhibited.

In this embodiment, the case, in which the corresponding inclined planes 411B and 411C are formed for both the vicinity of the lateral boundaries 31B and 31C of the light emitting region 31 has been described. However, it is possible to form either of the inclined planes 411B and 411C correspondingly to one lateral boundary. Further, the inclined planes 411B and 411C can be formed not only in the main-emitting-side end face 11, but also in the opposite-side end face 12.

Fifth Embodiment

Figure 16:
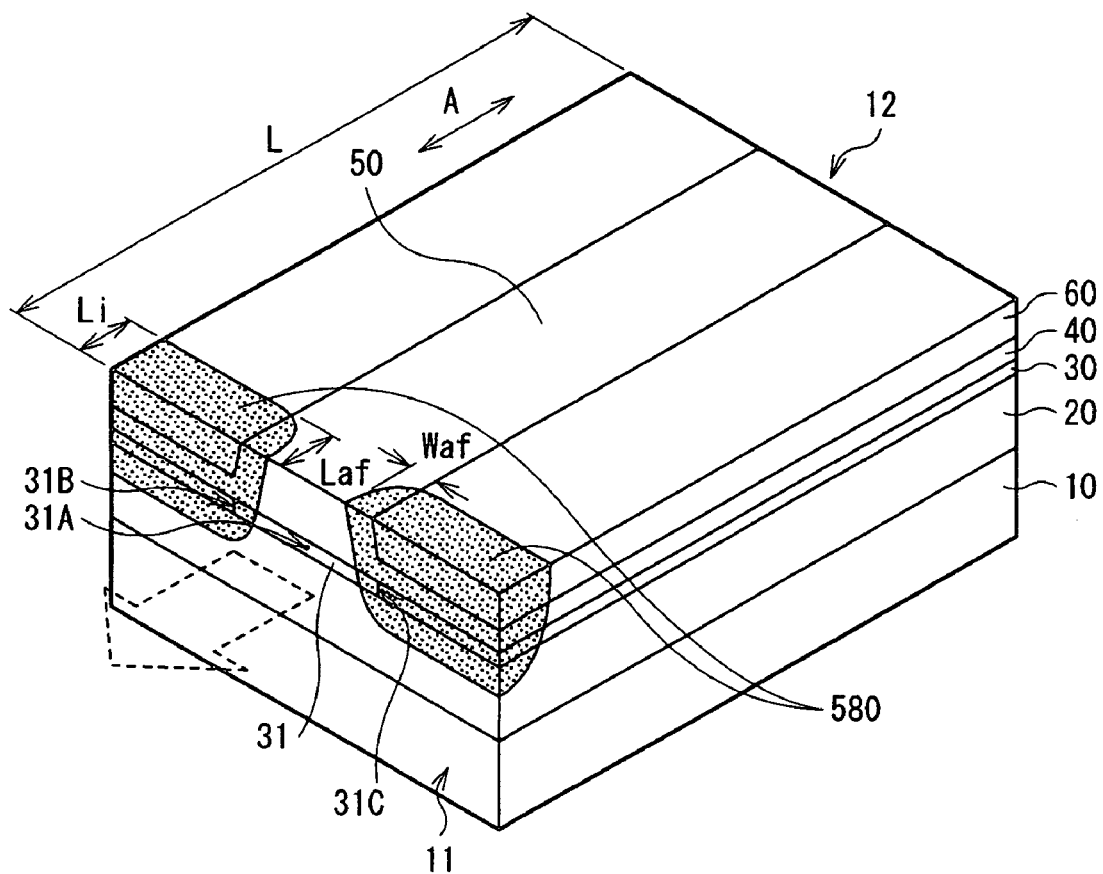
FIG. 16 is a perspective view showing a construction of a laser diode according to a fifth embodiment of the invention.
Figure 17:
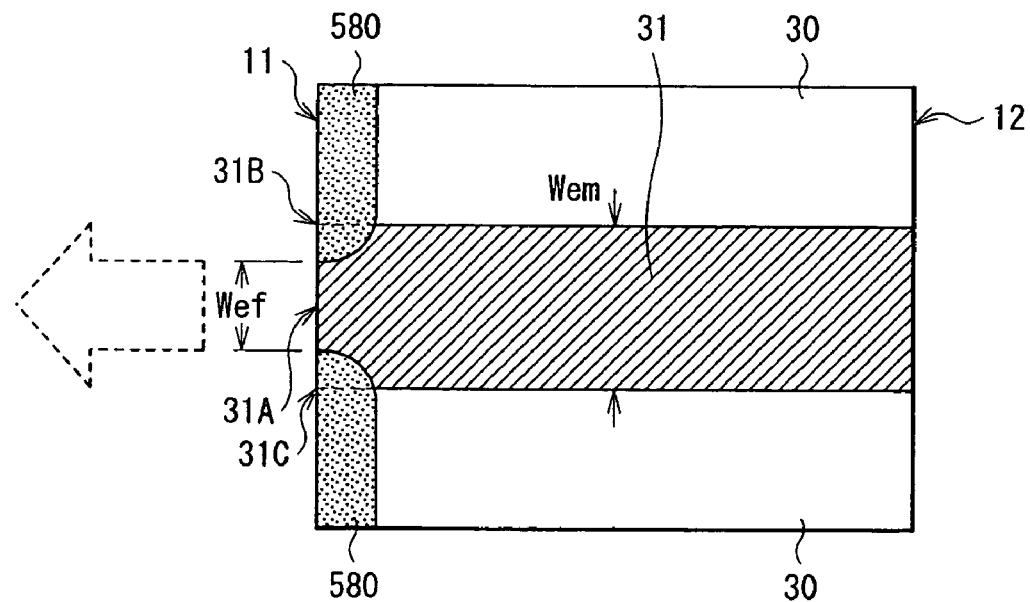
FIG. 17 is a plan view showing a pattern diagram of a shape of a light emitting region of the laser diode shown in FIG. 16.

FIG. 16 shows a construction of a laser diode according to the fifth embodiment. FIG. 17 shows a planar shape of a light emitting region (shaded portion) of the laser diode shown in FIG. 16. This laser diode has the same construction as of the laser diode of the first embodiment, except that the laser diode of this embodiment has an impurity-doped region 580 in a pair of corners of the main-emitting-side end face 11 side. Therefore, descriptions will be given by giving the same reference symbols to the corresponding components. In FIGS. 16 and 17, the impurity-doped region 580 is shown as a half-tone dot meshed portion.

The impurity-doped region 580 includes a corner of the projecting part 50 in the main-emitting-side end face 11. Thereby, in this laser diode, optical loss is intentionally generated in the impurity-doped region 580, so that even if return light approaches or enters in the vicinity of the lateral boundaries 31B and 31C of the light emitting region 31, the effects thereof can be inhibited. A preferable impurity density of the impurity-doped region 580 is, for example, $1 \times 10^{16}/cm^3$ to $1 \times 10^{20}/cm^3$. In this range, desirable and appropriate optical loss can be generated. The impurity-doped region 580 corresponds to one specific example of the return light inhibition parts in the invention.

An impurity included in the impurity-doped region 580 can be any typical impurity used for semiconductors regardless of materials of the laser diode. For example, silicon (Si), selenium (Se), tellurium (Te), magnesium (Mg), zinc (Zn), cadmium (Cd), or carbon (C) can be cited.

Further, when the active layer 30 is made of a group III-V compound semiconductor, the impurity included in the impurity-doped region 580 may be an element of group III or group V, which is not included in the active layer 30. For example, when the active layer 30 is made of an AlGaAs mixed crystal in the GaAs laser diode as in this embodiment, boron (B), indium (In), nitrogen (N), phosphorous (P), or antimony (Sb) can be cited as an impurity.

Otherwise, when the active layer 30 is made of GaInN in a nitride laser diode, aluminum (Al), boron (B), phosphorous (P), arsenic (As), or antimony (Sb) can be cited as an impurity. When the active layer 30 is made of GaInAsP in an InP laser diode, boron (B), aluminum (Al), nitrogen (N), or antimony (Sb) can be cited as an impurity.

Even if an impurity injection depth Di of the impurity-doped region 580 is shallow, effects can be obtained to some extent. However, Di preferably reaches the active layer 30. Thereby, the width Wef of the light emitting region 31 in the vicinity of the main-emitting-side end face 11 can be surely narrower than the width Wem. Further, the impurity density of the impurity-doped region 580 is not such a value that changes the refractive index. Therefore, even if Di reaches the active layer 30, troubles may be hardly caused.

A length Li of the impurity-doped region 580 is preferably 1% to 50% of the length L of the projecting part 50 in the resonator direction A. When the value is less than 1%, a narrow part of the width Wef of the light emitting region 31 in the vicinity of the main-emitting-side end face 11 becomes small, and therefore, effects are not sufficient. Meanwhile, when the value is more than 50%, changes between the width Wem and the width Wef of the light emitting region 31 are too modest, and therefore, sufficient effects may not be obtained.

The width Waf and the length Laf, in the part the impurity-doped region 580 is overlapped with the corner of the projecting part 50 are similar to of the notch part 51 of the first embodiment.

This laser diode can be manufactured, for example, as follows.

First, for example, as in the first embodiment, over the substrate 10, the n-type semiconductor layer 20, the active layer 30, and the p-type semiconductor layer 40 are sequentially laminated by MOCVD method. Then, the projecting part 50 and the buried layer 60 on the both sides thereof are formed.

After the buried layer 60 is formed, an unshown mask is formed on the p-type semiconductor layer 40 and the buried layer 60. By using this mask, an impurity is doped to the pair of corners of the main-emitting-side end face 11 by, for example, ion implantation or diffusion to form the impurity-doped region 580. Then, the impurity-doped region 580 shall fall on the corner of the projecting part 50 in the main-emitting-side end face 11.

After the impurity-doped region 580 is formed, the rear face side of the substrate 10 is lapped to obtain a thin film having the foregoing thickness. The n-side electrode and the p-side electrode are formed respectively as in the first embodiment. After the n-side electrode and the p-side electrode are formed, the substrate 10 is adjusted to a given size. On the main-emitting-side end face 11 and the opposite-side end face 12, reflector films (not shown) are formed. Thereby, the laser diode shown in FIG. 16 is formed.

In this laser diode, when a given voltage is applied between the n-side electrode and the p-side electrode, a driving current supplied from the p-side electrode is current-confined by the projecting part 50, and then injected into the light emitting region 31 of the active layer 30. Then, light emitting is generated by electron-hole recombination. The light is reflected by the pair of reflector films (not shown), travels between them, generates laser oscillation, and is emitted outside as laser beams. Then, the impurity-doped region 580 provided in the pair of corners of the main-emitting-side end face 11 includes the corners of the projecting part 50 in the main-emitting-side end face 11. Therefore, optical loss is generated in the impurity-doped region 580. Consequently, even if return light approaches or enters in the vicinity of the lateral boundaries 31B and 31C of the light emitting region 31, the effects thereof can be inhibited.

As above, in this embodiment, the impurity-doped region 580 is provided in the pair of corners of the main-emitting-side end face 11, and this impurity-doped region 580 includes the corners of the projecting part 50 in the main-emitting-side end face 11. Therefore, optical loss can be intentionally generated in the impurity-doped region 580. Consequently, even if return light approaches or enters in the vicinity of the lateral boundaries 31B and 31C of the light emitting region 31, the effects thereof can be inhibited.

In this embodiment, the case, in which the impurity-doped region 580 is provided in both of the pair of corners of the main-emitting-side end face 11 has been described. However, it is possible to provide the impurity-doped region 580 only in one corner. Further, the impurity-doped region 580 can be provided not only in the main-emitting-side end face 11, but also in the opposite-side end face 12.

Though the invention has been described with reference to the embodiments, the invention is not limited to the foregoing embodiments, and various modifications may be made. For example, the materials, the thicknesses, the deposition methods, the deposition conditions and the like, which are described in the foregoing embodiments are not limited. Other material, other thickness, other deposition method, and other deposition conditions may be applied. For example, in the foregoing embodiments, silicon is used as an n-type impurity. However, other n-type impurity such as selenium (Se) may be used.

Further, in the foregoing embodiments, the case that the semiconductor layer is developed by MOCVD method has been described. However, the semiconductor layer may be developed by other method such as MBE (Molecular Beam Epitaxy) method.

Further, in the foregoing embodiments, constructions of the laser diode have been described with reference to the specific examples. However, the invention can be similarly applied to a laser diode having other structure. For example, an optical guide layer may be provided between the active layer and the n-type cladding layer or the p-type cladding layer.

In addition, in the foregoing embodiments, the broad area laser diode has been described. However, in the invention, the width of the light emitting region is not particularly limited. Therefore, the invention can be applied to a narrow stripe laser diode.

Further, in the foregoing embodiments, the materials for the laser diode have been described with reference to the specific examples. However, the invention can be widely applied not only to the GaAs device described in the foregoing embodiments, but also to the case using other semiconductor material such as a group III-V compound semiconductor such as AlGaInP and InP, a nitride group III-V compound semiconductor, and a group II-VI compound semiconductor.

Further, in the foregoing embodiments, the case that the physical or substantial shape of the projecting part 50 or the light emitting region 31 is changed, or the case that the light intensity distribution in the light emitting region 31 is adjusted have been described. However, it is possible to change the shape of the p-side electrode without changing the shape of the projecting part 50 or the light emitting region 31.

This invention can be applied to a semiconductor light emitting device such as an LED (Light Emitting Diode) in addition to the laser diode.

The laser diode, particularly the broad area laser diode of the invention can be applied to various fields such as a light source for an optical disk device, a display, a printing product, fabricating materials, and medical care.

It should be understood by those skilled in the art that various modifications, combinations, sub-combinations and alterations may occur depending on design requirements and other factors insofar as they are within the scope of the appended claims or the equivalents thereof.

What is claimed is:

1. A laser diode comprising:
a substrate; and
a laminated structure including
a first conductive semiconductor layer,
an active layer having a light emitting region, and
a second conductive semiconductor layer having a projecting part on the surface thereof, on the substrate, wherein:
a return light inhibition part is provided on a main-emitting-side end face, and effects of return light in the vicinity of lateral boundaries of the light emitting region are inhibited by the return light inhibition part,
a reflector film is included in the main-emitting-side end face side as the return light inhibition part, and
in the reflector film, laser light reflectance to the vicinity of a lateral center of the light emitting region is higher than laser light reflectance to the vicinity of lateral boundaries of the light emitting region,
wherein the reflector film includes:
a first coating layer covering a whole area of the main-emitting-side end face; and
a second coating layer on said first coating layer and covers the vicinity of the lateral center of the light emitting region, the width of the second coating layer being 20% to 80% of the width of the light emitting region in the vicinity of the center between the main-emitting-side end face and an opposite-side end face,
wherein a difference between the laser light reflectance to the vicinity of the lateral center and the laser light reflectance to the vicinity of the lateral boundaries of the light emitting region is 5% to 30%.

2. A laser diode comprising:
a semiconductor layer of a first conductivity type between a substrate and an active layer, a portion of said active layer being a light emitting region;
a semiconductor layer of a second conductivity type on said active layer, said light emitting region being between said semiconductor layer of the first conductivity type and a projecting part of said semiconductor layer of the second conductivity type;
a buried layer of said first conductivity type in contact with said projecting part, another part of said semiconductor layer of the second conductivity type being between said buried layer and said active layer,
wherein a width of said projecting part at a main-emitting-side end face is less that a width of said projecting part between said main-emitting-side end face and an opposite-side end face.

3. The laser diode according to claim 2, further comprising:
a reflector film on said main-emitting-side end face and another reflector film on said opposite-side end face, a reflectance of said reflector film being lower than a reflectance of said another reflector film.

4. The laser diode according to claim 2, wherein said second conductivity type is opposite said first conductivity type.

5. The laser diode according to claim 2, wherein a width (Wef) of said light emitting region at said main-emitting-side end face is less that a width (Wem) of said light emitting region between said main-emitting-side end face and said opposite-side end face.

6. The laser diode according to claim 5, wherein said width (Wem) is 10 μm or more.

7. The laser diode according to claim 2, wherein a notch part is provided at least in one corner of said projecting part.

8. The laser diode according to claim 7, wherein a width (Waf) of said notch part 1% to 20% of said width (Wrm) of said projecting part between said main-emitting-side end face and an opposite-side end face.

9. The laser diode according to claim 7, wherein a length (Laf) of said notch part is 0.1% to 20% of a length (L) of said projecting part in a resonator direction.

10. The laser diode according to claim 2, wherein an impurity-doped region is provided at least in one corner of said projecting part in said main-emitting-side end face.

11. The laser diode according to claim 10, wherein the impurity-doped region reaches said active layer.

12. The laser diode according to claim 2, wherein a normal end face of said main-emitting-side end face is parallel to said opposite-side end face, an inclined plane of said main-emitting-side end face being inclined to said normal end face.

13. The laser diode according to claim 12, wherein said normal end face includes vicinity of a lateral center of said light emitting region.

14. The laser diode according to claim 12, wherein said inclined plane includes vicinity of a lateral boundary of said light emitting region.

* * * * *